(12) United States Patent
Hwang et al.

(10) Patent No.: US 10,038,428 B2
(45) Date of Patent: Jul. 31, 2018

(54) SEQUENTIAL CIRCUIT AND OPERATING METHOD THEREOF

(71) Applicant: Samsung Electronics Co., Ltd., Suwon-si, Gyeonggi-do (KR)

(72) Inventors: Hyunchul Hwang, Suwon-si (KR); Minsu Kim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 15/254,272

(22) Filed: Sep. 1, 2016

(65) Prior Publication Data

US 2017/0070215 A1   Mar. 9, 2017

(30) Foreign Application Priority Data

Sep. 7, 2015  (KR) ........................ 10-2015-0126420

(51) Int. Cl.
| | | |
|---|---|---|
| *H03K 3/35* | (2006.01) | |
| *H03K 3/356* | (2006.01) | |
| *G11C 11/4074* | (2006.01) | |
| *G11C 11/4076* | (2006.01) | |
| *G11C 11/4093* | (2006.01) | |
| *H03K 19/20* | (2006.01) | |
| *G11C 7/10* | (2006.01) | |

(52) U.S. Cl.
CPC ..... *H03K 3/356121* (2013.01); *G11C 7/1006* (2013.01); *G11C 11/4074* (2013.01); *G11C 11/4076* (2013.01); *G11C 11/4093* (2013.01); *H03K 19/20* (2013.01)

(58) Field of Classification Search
CPC ............. H03K 19/20; H03K 3/356121; G11C 11/4074; G11C 11/4076; G11C 11/4093
USPC ................................ 327/199, 201, 202, 211
See application file for complete search history.

(56) References Cited

U.S. PATENT DOCUMENTS

| | | |
|---|---|---|
| 6,972,605 B1 | 12/2005 | Choe |
| 7,157,930 B2 | 1/2007 | Hirata |
| 7,345,519 B2 | 3/2008 | Hirata |
| 7,453,300 B2 | 11/2008 | Won et al. |
| 7,859,310 B2 | 12/2010 | Sumita |
| 8,508,275 B2 | 8/2013 | Sathianthan |
| 8,729,942 B2 | 5/2014 | Bazes |
| 8,933,740 B2 | 1/2015 | Hsieh |
| 2010/0315144 A1 | 12/2010 | Lee et al. |
| 2012/0139601 A1 | 6/2012 | Kim |

(Continued)

FOREIGN PATENT DOCUMENTS

KR       20100134839 A       12/2010

*Primary Examiner* — John Poos
(74) *Attorney, Agent, or Firm* — Harness, Dickey & Pierce, P.L.C.

(57) ABSTRACT

In a sequential circuit, a first stage is configured to charge a voltage of a first node in response to a clock, and to discharge the voltage of the first node in response to the clock, a voltage of a second node, and data; a second stage is configured to charge the voltage of the second node in response to the clock, and to discharge the voltage of the second node in response to the clock and a logic signal; a combinational logic is configured to generate the logic signal based on the voltage of the first node, the voltage of the second node, and the data; and a latch circuit is configured to latch the voltage of the second node in response to the clock.

30 Claims, 17 Drawing Sheets

(56) References Cited

U.S. PATENT DOCUMENTS

2013/0241617 A1\* 9/2013 Kim ............... G01R 31/318541
 327/225

\* cited by examiner

SEQUENTIAL CIRCUIT AND OPERATING METHOD THEREOF

CROSS-REFERENCE TO RELATED APPLICATION

This U.S. non-provisional application claims priority under 35 U.S.C. § 119 to Korean Patent Application No. 10-2015-0126420 filed on Sep. 7, 2015, in the Korean Intellectual Property Office, the entire contents of which is incorporated herein by reference.

BACKGROUND

Field

Example embodiments of inventive concepts relate to sequential circuits and/or operating methods thereof.

Description of Related Art

A sequential circuit (e.g., a flip-flop) is used as a data storage element in digital circuits of semiconductor integrated circuits. A sequential circuit samples an input signal at a point in time determined by a clock signal, and changes the sampled input signal into an output signal. Sequential circuits are used in semiconductor memory devices (e.g., dynamic random access memories (DRAMs)), processors, computers, etc.

SUMMARY

One or more example embodiments of inventive concepts provide relatively high-speed sequential circuits and/or operating methods thereof.

At least one example embodiment provides sequential circuit including: a first stage configured to charge a voltage of a first node in response to a clock, the first stage further configured to discharge the voltage of the first node in response to the clock, a voltage of a second node, and data; a second stage configured to charge the voltage of the second node in response to the clock, the second stage further configured to discharge the voltage of the second node in response to the clock and a logic signal; a combinational logic configured to generate the logic signal based on the voltage of the first node, the voltage of the second node, and the data; and a latch circuit configured to latch the voltage of the second node in response to the clock. The combinational logic is further configured to generate the logic signal such that (i) the voltage of the second node is not discharged when the voltage of the first node is discharged, or (ii) the voltage of the first node is not discharged when the voltage of the second node is discharged.

According to at least some example embodiments, the first stage may include: a first transistor configured to connect the first node to a power supply terminal in response to the clock; a second transistor configured to connect the first node to the power supply terminal in response to the voltage of the second node; and a third transistor configured to connect a first connection node to the first node in response to the clock.

The second stage may include: a fourth transistor configured to connect the second node to the power supply terminal in response to the clock; a fifth transistor configured to connect the second node to the power supply terminal in response to the voltage of the first node; a sixth transistor configured to connect the second node to a second connection node in response to the logic signal; and a seventh transistor configured to connect a ground terminal to the second connection node in response to the clock. The first connection node may be connected to a gate terminal of the sixth transistor.

The combinational logic may include: an inverter configured to invert the voltage of the first node; and an AND-OR-Inverter (AOI) gate configured to generate the logic signal based on the voltage of the second node, the data, and an output of the inverter.

According to at least some example embodiments, the sequential circuit may include: a fourth transistor having a first terminal connected to the second node; and a fifth transistor configured to connect a ground terminal to a second terminal of the fourth transistor in response to the clock.

According to at least some example embodiments, the latch circuit may include: a first transistor configured to connect an output node to a power supply terminal in response to the voltage of the second node; a second transistor having a first terminal connected to the output node; a third transistor configured to connect a second terminal of the second transistor to a ground terminal in response to the voltage of the second node; and a buffer configured to buffer a voltage of the output node.

The latch circuit may further include an inverter configured to invert the voltage of the output node.

According to at least some example embodiments, the first stage may include: a first transistor having a first terminal connected to the first node; a second transistor configured to connect the first node to a power supply terminal in response to the voltage of the second node; a third transistor configured to connect a second terminal of the first transistor to the power supply terminal in response to a scan input; a fourth transistor configured to connect the second terminal of the first transistor to the power supply terminal in response to a scan enable signal; a fifth transistor configured to connect a first connection node to the first node in response to the clock; a sixth transistor having a first terminal connected to the first node; a seventh transistor having a first terminal connected to a second terminal of the sixth transistor of the first stage; and an eighth transistor configured to connect a second terminal of the seventh transistor to a ground terminal in response to the voltage of the second node.

The combinational logic may include: an inverter configured to invert the voltage of the first node; and an AOI gate configured to generate the logic signal based on an output of the inverter, an inverted scan enable signal, the voltage of the second node, and the data, and an output terminal of the AOI gate is connected to the first connection node.

According to at least some example embodiments, the first stage may include: a first transistor configured to connect the first node to a power supply terminal in response to the clock; a second transistor configured to connect the first node to the power supply terminal in response to the voltage of the second node; and a third transistor configured to connect a first connection node to the first node in response to the clock. The combinational logic may include: an inverter configured to invert the voltage of the first node; a multiplexer configured to select one of the data and a scan input in response to a scan enable signal; and an AOI gate configured to generate the logic signal based on an output of the multiplexer, the voltage of the second node, and an output of the inverter, and an output terminal of the AOI gate is connected to the first connection node.

According to at least some example embodiments, the first stage may include: a first transistor having a first terminal connected to the first node; a second transistor configured to connect the first node to a power supply terminal in response to the voltage of the second node; a third transistor configured to connect a second terminal of the first transistor to the power supply terminal in response to a scan input; a fourth transistor configured to connect the second terminal of the first transistor to the power supply terminal in response to a scan enable signal; a fifth transistor configured to connect a first connection node to the first node in response to the clock; a sixth transistor having a first terminal connected to the first node; and a seventh transistor configured to connect a second connection node to a second terminal of the sixth transistor in response to the scan enable signal.

The combinational logic may include: an inverter configured to invert the voltage of the first node; a eighth transistor having a first terminal connected to the first connection node, and a gate configured to receive an output of the inverter; a ninth transistor configured to connect a second terminal of the eighth transistor to the power supply terminal in response to the data; a tenth transistor configured to connect the second terminal of the eighth transistor to the power supply terminal in response to an inverted scan enable signal; a eleventh transistor configured to connect the second terminal of the eighth transistor to the power supply terminal in response to the voltage of the second node; a twelfth transistor configured to connect the ground terminal to the first connection node in response to the output of the inverter, a thirteenth transistor having a first terminal connected to the first connection node; a fourteenth transistor configured to connect a second terminal of the thirteenth transistor to the second connection node in response to the inverted scan enable signal; and a fifteenth transistor configured to connect the ground terminal to the second connection node in response to the voltage of the second node.

At least one other example embodiment provides a sequential circuit including: a first stage; a second stage; a combinational logic; and a latch circuit. The first stage includes: a first transistor having a first terminal connected to a first node; a second transistor configured to connect the first node to a power supply terminal in response to a voltage of a second node; a third transistor configured to connect a second terminal of the first transistor to the power supply terminal in response to a scan input; a fourth transistor configured to connect the second terminal of the first transistor to the power supply terminal in response to a scan enable signal; a fifth transistor configured to connect a first connection node to the first node in response to the clock; a sixth transistor having a first terminal connected to the first node; and a seventh transistor configured to connect a second connection node to a second terminal of the sixth transistor in response to the scan enable signal. The second stage includes: an eighth transistor configured to connect the second node to the power supply terminal in response to the clock; a ninth transistor configured to connect the second node to the power supply terminal in response to a voltage of the first node; a tenth transistor having a first terminal connected to the second node; and an eleventh transistor configured to connect a ground terminal to a second terminal of the tenth transistor in response to the clock. The combinational logic is configured to generate the logic signal based on data, the voltage of the first node, and a voltage of the second node, the combinational logic further configured to output the logic signal to the first connection node. The latch circuit is configured to latch the voltage of the second node in response to the clock.

According to at least some example embodiments, the combinational logic may include: an inverter configured to invert the voltage of the first node; a twelfth transistor having a first terminal connected to the first connection node; a thirteenth transistor configured to connect a second terminal of the twelfth transistor to the power supply terminal in response to the data; a fourteenth transistor configured to connect the second terminal of the twelfth transistor to the power supply terminal in response to an inverted scan enable signal; a fifteenth transistor configured to connect the second terminal of the twelfth transistor to the power supply terminal in response to the voltage of the second node; a sixteenth transistor configured to connect the ground terminal to the first connection node in response to the output of the inverter; a seventeenth transistor having a first terminal connected to the first connection node; an eighteenth transistor configured to connect a second terminal of the seventeenth transistor to the second connection node in response to the inverted scan enable signal; and a nineteenth transistor configured to connect the ground terminal to the second connection node in response to the voltage of the second node.

According to at least some example embodiments, the second stage may further include: a twelfth transistor configured to connect a first terminal of the eighth transistor to the power supply terminal in response to a reset signal, and connect a first terminal of the ninth transistor to the power supply terminal in response to the reset signal; and a thirteenth transistor configured to connect the ground terminal to the second node in response to the reset signal.

According to at least some example embodiments, the combinational logic may include: an inverter configured to invert the voltage of the first node; a twelfth transistor having a first terminal connected to the first connection node; a thirteenth transistor configured to connect a second terminal of the twelfth transistor to the power supply terminal in response to the data; a fourteenth transistor configured to connect the second terminal of the twelfth transistor to the power supply terminal in response to an inverted scan enable signal; a fifteenth transistor configured to connect the first connection node to the power supply terminal in response to the voltage of the second node; a sixteenth transistor configured to connect the ground terminal to the first connection node in response to an output of the inverter; a seventeenth transistor having a first terminal connected to the first connection node; an eighteenth transistor configured to connect a second terminal of the seventeenth transistor to the second connection node in response to the inverted scan enable signal; and a nineteenth transistor configured to connect the ground terminal to the second connection node in response to the voltage of the second node.

According to at least some example embodiments, the combinational logic may include: an inverter configured to invert the voltage of the first node; a twelfth transistor having a first terminal connected to the first connection node; a thirteenth transistor configured to connect a second terminal of the twelfth transistor to the power supply terminal in response to the data; a fourteenth transistor configured to connect the second terminal of the twelfth transistor to the power supply terminal in response to an inverted scan enable signal; a fifteenth transistor configured to connect the second terminal of the twelfth transistor to the power supply terminal in response to the voltage of the second node; a sixteenth transistor configured to connect the second connection node to the first connection node in response to an output of the inverter; a seventeenth transistor having a first terminal connected to the first connection node; a eighteenth transistor configured to connect a second terminal of the seventeenth transistor to the second connection node in response to the inverted scan enable signal; and a nineteenth transistor configured to connect the ground terminal to the second connection node in response to the voltage of the second node.

According to at least some example embodiments, the combinational logic may include: an inverter configured to invert the voltage of the first node; a twelfth transistor having a first terminal connected to the first connection node; a thirteenth transistor configured to connect a second terminal of the twelfth transistor to the power supply terminal in response to the data; a fourteenth transistor configured to connect the second terminal of the twelfth transistor to the power supply terminal in response to an inverted scan enable signal; a fifteenth transistor configured to connect the first connection node to the power supply terminal in response to the voltage of the second node; a sixteenth transistor configured to connect the second connection node to the first connection node in response to an output of the inverter; a seventeenth transistor having a first terminal connected to the first connection node; an eighteenth transistor configured to connect a second terminal of the seventeenth transistor to the second connection node in response to the inverted scan enable signal; and a nineteenth transistor configured to connect the ground terminal to the second connection node in response to the voltage of the second node.

At least one other example embodiment provides a sequential circuit including: a first stage, a second stage, a combinational logic, and a latch circuit. The first stage includes: a first transistor configured to connect a first node to a power supply terminal in response to a clock; a second transistor configured to connect the first node to the power supply terminal in response to a voltage of a second node; and a third transistor configured to connect a first connection node to the first node in response to the clock. The second stage includes: a fourth transistor configured to connect the second node to the power supply terminal in response to the clock; a fifth transistor configured to connect the second node to the power supply terminal in response to a voltage of the first node; a sixth transistor configured to connect the second node to a second connection node in response to a logic signal; and a seventh transistor configured to connect a ground terminal to the second connection node in response to the clock. The combinational logic includes: an inverter configured to invert the voltage of the second node; and an AOI gate configured to generate the logic signal based on an output of the inverter, the voltage of the second node, and data. The latch circuit is configured to latch the voltage of the second node in response to the clock.

According to at least some example embodiments, an output terminal of the AOI gate may be connected to the first connection node.

The sequential circuit may further include a discharge circuit configured to discharge the voltage of the first node from the first connection node to the ground terminal.

The sequential circuit may further include an inverter configured to invert an output of the latch circuit.

At least one other example embodiment provides an operating method of a sequential circuit, the method comprising: charging at least one of a first node and a second node in response to a clock; discharging a voltage of the first node in response to the clock; and discharging a voltage of the second node in response to the clock and a logic signal. The logic signal is generated according to a logical combination of the voltage of the first node, the voltage of the second node, and data. The voltage of the second node is not discharged when the voltage of the first node is discharged, and the voltage of the first node is not discharged when the voltage of the second node is discharged.

According to at least some example embodiments, the method may further include: latching data corresponding to the voltage of the second node in response to the clock; inverting the latched data; forming a scan path in response to a scan enable signal; and/or resetting the voltage of the first node and the voltage of the second node in response to a reset signal.

At least one other example embodiment provides a processor including a first sequential circuit and a second sequential circuit. The second sequential circuit is serially connected to the first sequential circuit. Each of the first and second sequential circuits are configured to: generate a logic signal in response to a voltage of a first node, a voltage of a second node, and data; and determine, in response to the logic signal, whether to discharge the voltage of the first node or the voltage of the second node. Each of the first and second sequential circuits are further configured such that (i) the voltage of the second node is not discharged when the voltage of the first node is discharged, and (ii) the voltage of the first node is not discharged when the voltage of the second node is discharged.

At least one other example embodiment provides a sequential circuit including: a first stage circuit; a second stage circuit; and a combinational logic circuit coupled between a first node of the first stage circuit and a second node of the second stage circuit. The combinational logic circuit is configured to control discharging of the first node and the second node based on a voltage at the first node, a voltage at the second node, and input data, the combinational logic is further configured to control discharging of the first node and the second node such that the first node is discharged during a first time interval and the second node is discharged during a second time interval, the first and second time intervals being different and non-overlapping time intervals.

The sequential circuit may further include a latch circuit configured to latch the voltage at the second node in response to a clock signal.

The combinational logic circuit may be further configured to generate a logic signal to control the discharging of the first node and the second node, the logic signal generated based on the voltage at the first node, the voltage at the second node, and the input data.

The first stage circuit may be configured to charge the first node based on a clock signal. The first stage circuit may be configured to discharge the first node based on the clock signal, the voltage at the second node, and the input data. The second stage may be configured to charge the second node based on the clock signal, and the second stage may be configured to discharge the second node based on the clock signal and the logic signal.

BRIEF DESCRIPTION OF THE DRAWINGS

Example embodiments will become apparent from the following description with reference to the figures, wherein like reference numerals refer to like parts throughout the various figures unless otherwise specified, and wherein.

DETAILED DESCRIPTION

Figure 1:
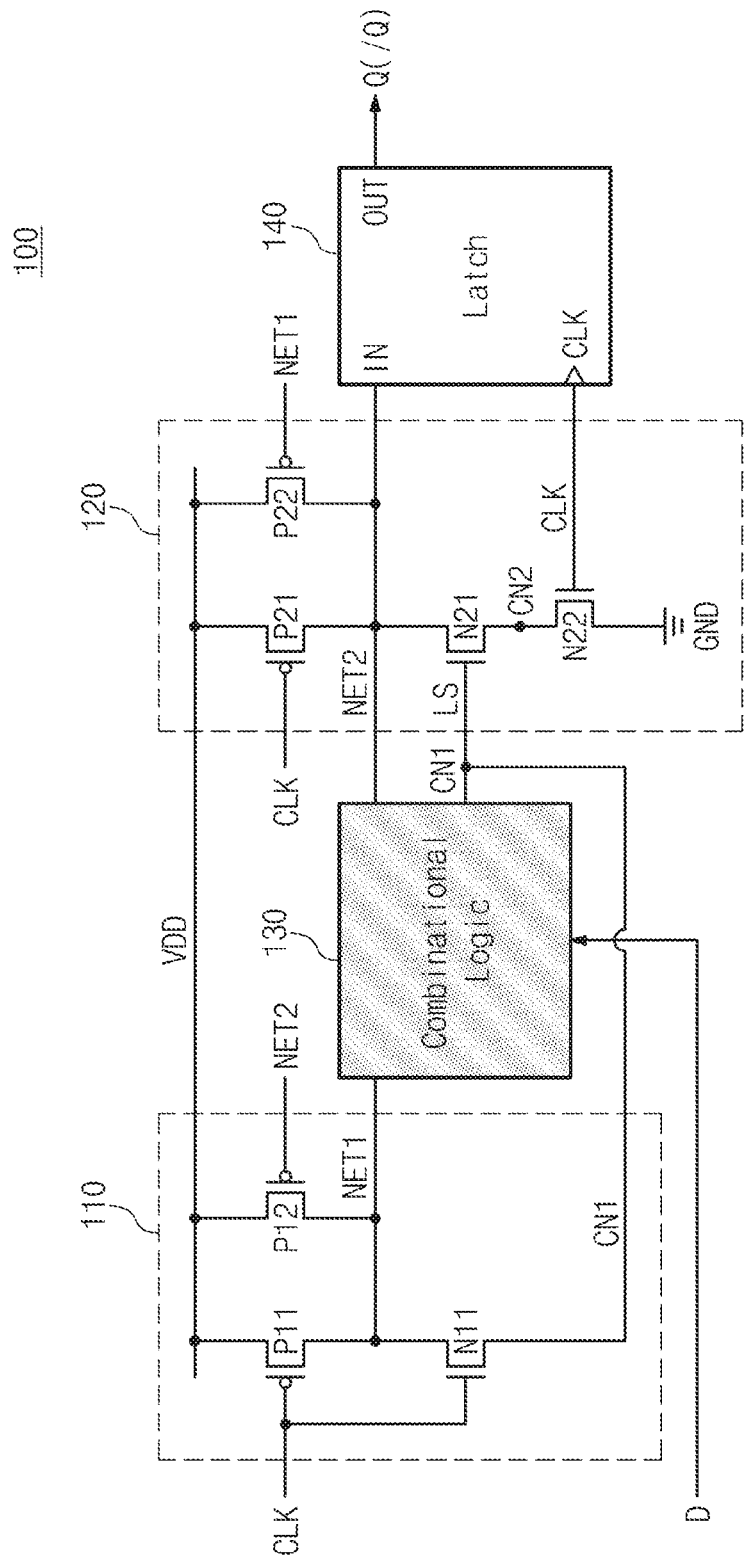
FIG. 1 is a diagram illustrating a sequential circuit according to an example embodiment of inventive concepts.

Inventive concepts will become more readily understood by reference to the following detailed description of example embodiments and the accompanying drawings. Inventive concepts may, however, be embodied in many different forms and should not be construed as being limited to the example embodiments set forth herein. Rather, these example embodiments are provided so that this disclosure will be thorough and complete and will fully convey concept of the inventive concepts to those skilled in the art, and the inventive concepts will only be defined by the appended claims. Like reference numerals refer to like elements throughout the specification.

The terminology used herein is for the purpose of describing particular embodiments only and is not intended to be limiting of inventive concepts. As used herein, the singular forms "a", "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of inventive concepts.

Spatially relative terms, such as "beneath", "below", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Example embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these example embodiments should not be construed as limited to the particular shapes of regions illustrated herein, but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of inventive concepts.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Specific details are provided in the following description to provide a thorough understanding of example embodiments. However, it will be understood by one of ordinary skill in the art that example embodiments may be practiced without these specific details. For example, systems may be shown in block diagrams so as not to obscure the example embodiments in unnecessary detail. In other instances, well-known processes, structures and techniques may be shown without unnecessary detail in order to avoid obscuring example embodiments.

In the following description, illustrative embodiments may be described with reference to acts and symbolic representations of operations (e.g., in the form of flow charts, flow diagrams, data flow diagrams, structure diagrams, block diagrams, etc.) that may be implemented as program modules or functional processes including routines, programs, objects, components, data structures, etc., that perform particular tasks or implement particular abstract data types. The operations may be implemented using existing hardware in existing electronic systems (e.g., display drivers, System-on-Chip (SoC) devices, SoC systems, electronic devices, such as personal digital assistants (PDAs), smartphones, tablet personal computers (PCs), laptop computers, etc.). Such existing hardware may include one or more Central Processing Units (CPUs), digital signal processors (DSPs), application-specific-integrated-circuits (ASICs), systems-on-chip (SoCs), field programmable gate arrays (FPGAs), computers, or the like.

Further, one or more example embodiments may be (or include) hardware, firmware, hardware executing software, or any combination thereof. Such hardware may include one or more CPUs, SoCs, DSPs, ASICs, FPGAs, computers, or the like, configured as special purpose machines to perform the functions described herein as well as any other well-known functions of these elements. In at least some cases, CPUs, SoCs, DSPs, ASICs and FPGAs may generally be referred to as processing circuits, processing circuitry, processors and/or microprocessors.

Although a flow chart may describe operations as a sequential process, many of the operations may be performed in parallel, concurrently or simultaneously. In addition, the order of the operations may be re-arranged. A process may be terminated when its operations are completed, but may also have additional steps not included in the figure. A process may correspond to a method, function, procedure, subroutine, subprogram, etc. When a process corresponds to a function, its termination may correspond to a return of the function to the calling function or the main function.

As disclosed herein, the term "storage medium", "computer readable storage medium" or "non-transitory computer readable storage medium," may represent one or more devices for storing data, including read only memory (ROM), random access memory (RAM), magnetic RAM, core memory, magnetic disk storage mediums, optical storage mediums, flash memory devices and/or other tangible machine readable mediums for storing information. The term "computer-readable medium" may include, but is not limited to, portable or fixed storage devices, optical storage devices, and various other mediums capable of storing, containing or carrying instruction(s) and/or data.

Furthermore, at least some portions of example embodiments may be implemented by hardware, software, firmware, middleware, microcode, hardware description languages, or any combination thereof. When implemented in software, firmware, middleware or microcode, the program code or code segments to perform the necessary tasks may be stored in a machine or computer readable medium such as a computer readable storage medium. When implemented in software, processor(s), processing circuit(s), or processing unit(s) may be programmed to perform the necessary tasks, thereby being transformed into special purpose processor(s) or computer(s).

A code segment may represent a procedure, function, subprogram, program, routine, subroutine, module, software package, class, or any combination of instructions, data structures or program statements. A code segment may be coupled to another code segment or a hardware circuit by passing and/or receiving information, data, arguments, parameters or memory contents. Information, arguments, parameters, data, etc. may be passed, forwarded, or transmitted via any suitable means including memory sharing, message passing, token passing, network transmission, etc.

As discussed herein, an "end" of a transistor may also be referred to as a "terminal" of the transistor.

FIG. 1 is a diagram illustrating a sequential circuit according to an example embodiment of inventive concepts.

Referring to FIG. 1, a sequential circuit 100 may include a first stage 110, a second stage 120, a combinational logic 130, and a latch circuit 140. In one example, the sequential circuit 100 may be a flip-flop.

The first stage 110 may include two PMOS transistors P11 and P12 and an NMOS transistor N11. The first PMOS transistor P11 of the first stage 110 may be connected between a power supply terminal VDD and a first node NET1 and may be turned on or off in response to a clock CLK. The second PMOS transistor P12 of the first stage 110 may be connected between the power supply terminal VDD and the first node NET1 and may be turned on or off in response to a voltage of a second node NET2. The NMOS transistor N11 of the first stage 110 may be connected between the power supply terminal VDD and the first node NET1 and may be turned on or off in response to the clock CLK. The first stage 110 may determine a voltage of the first node NET1 and a voltage of a first connection node CN1 in response to the clock CLK and a voltage of the second node NET2. Here, the first connection node CN1 may be connected to an output terminal of the combinational logic 130.

The second stage 120 may be complementary to the first stage 110 and may include two PMOS transistors P21 and P22 and two NMOS transistors N21 and N22. The first PMOS transistor P21 of the second stage 120 may be connected between the power supply terminal VDD and the second node NET2, and may be turned on or off in response to the clock CLK. The second PMOS transistor P22 of the second stage 120 may be connected between the power supply terminal VDD and the second node NET2, and may be turned on or off in response to a voltage of the first node NET1. The first NMOS transistor N21 of the second stage 120 may be connected between the second node NET2 and a second connection node CN2, and may be turned on or off in response to a logic signal LS. That is, for example, the first NMOS transistor N21 has one end connected to the second node NET2 and other end connected the second connection node CN2. The second NMOS transistor N22 of the second stage 120 may be connected between the second connection node CN2 and a ground terminal GND and may be turned on or off in response to the clock CLK. That is, for example, the second NMOS transistor may connect the ground terminal GND to the other end of the first NMOS transistor N21 in response to the clock CLK.

The second stage 120 may determine a voltage of the second node NET2 in response to the clock CLK, a voltage of the first node NET1, and the logic signal LS. In at least one example embodiment, the voltage of the first node NET1 may be complementary to the voltage of the second node NET2 during a set time period and/or interval (e.g., in a specific duration).

An example embodiment of inventive concepts is exemplified in FIG. 1 with regard to the first NMOS transistor N21 and the second NMOS transistor N22 being serially connected to each other. However, the scope and spirit of inventive concepts should not be limited thereto. For example, an NMOS transistor associated with the clock CLK may be connected to the second node NET2, and an NMOS transistor associated with the logic signal LS may be connected to the ground terminal GND.

The combinational logic 130 may receive the voltage of the first node NET1, the voltage of the second node NET2, and data D and may internally perform a logical operation using the voltage of the first node NET1, the voltage of the second node NET2, and data D. Accordingly, the combinational logic 130 may be implemented to generate the logic signal LS. The combinational logic 130 may be implemented with various types of logic circuits.

The latch circuit 140 may be implemented to latch the voltage of the second node NET2 in response to the clock CLK. The latch circuit 140 may output the latched data Q or/Q.

The conceptual operation of the sequential circuit 100 according to an example embodiment of inventive concepts is described below. When the clock CLK is at a low level, the first node NET1 and the second node NET2 may be charged with a voltage (e.g., VDD) of a high-level. That is, for example, when the clock CLK is at a low level, the first node NET1 and the second node NET2 may be charged regardless (or, alternatively, independent) of the data D. Afterwards, whether to discharge the first node NET1 or whether to discharge the second node NET2 may be determined based on the data D and the clock CLK, and data corresponding to the voltage of the second node NET2 may be latched according to the determination result in the latch circuit 140.

In at least one example embodiment, a discharge operation about the first node NET1 may be complementary to a discharge operation about the second node NET2. For example, an output value (e.g., Q or/Q) of the sequential circuit 100 may be determined by discharging one of the first node NET1 and the second node NET2 based on a state of the data D.

In at least one example embodiment, when one node (e.g., NET2) is discharged, a discharge operation about the other node (e.g., NET1) may be suppressed, prevented and/or blocked (e.g., completely blocked), and vice versa. For example, when one of the first and second nodes NET1 and NET2 is discharged, the combinational logic 130 may suppress, prevent and/or block the discharging of the other thereof until the discharged node is again charged. At this time, one of the PMOS transistor P12 and the PMOS transistor P22 may be turned on, and may connect the other node to the power supply terminal VDD.

Conventionally, a pulse-based sequential circuit may charge a node in response to a clock having a low state, and may determine whether to keep (or maintain) a voltage state of a node or whether to discharge the node based on a pulse generated using a clock, a clock of a high state, and a data state. The pulse-based sequential circuit may operate relatively rapidly. However, the pulse-based sequential circuit may be prone to clock changes.

On the other hand, the sequential circuit 100, according to at least one example embodiment of inventive concepts, may determine (e.g., complementarily determine) whether to discharge the nodes NET1 and NET2 based on the logic signal LS, which is determined according to voltages of the nodes NET1 and NET2 and a state of the data D, and the clock CLK. Accordingly, the sequential circuit 100 according to at least one example embodiment of inventive concepts may reduce and/or minimize influence due to a clock change as compared with conventional sequential circuits.

Moreover, a conventional pulse-based sequential circuit may be implemented with NMOS transistors having a 3-stack structure to discharge a node. On the other hand, the sequential circuit 100, according to at least one example embodiment, may be implemented with the NMOS transistors N21 and N22 having a 2-stack structure to discharge the second node NET2. Accordingly, compared with a conventional sequential circuit, the sequential circuit 100 according to at least one example embodiment of inventive concepts may perform a high-speed latch operation by increasing discharge speed.

Conventionally, a sequential circuit may influence a clock frequency of a system due to a setup time and a clock to output (CQ) delay. Accordingly, when a relatively high-performance sequential circuit, in which the setup time and the CQ delay are relatively small (e.g., very little) is used, increasing a clock frequency may relatively easy. The sequential circuit 100 according to at least one example embodiment of inventive concepts may reduce a setup time and/or the CQ delay, which may increase clock frequency.

Figure 2:
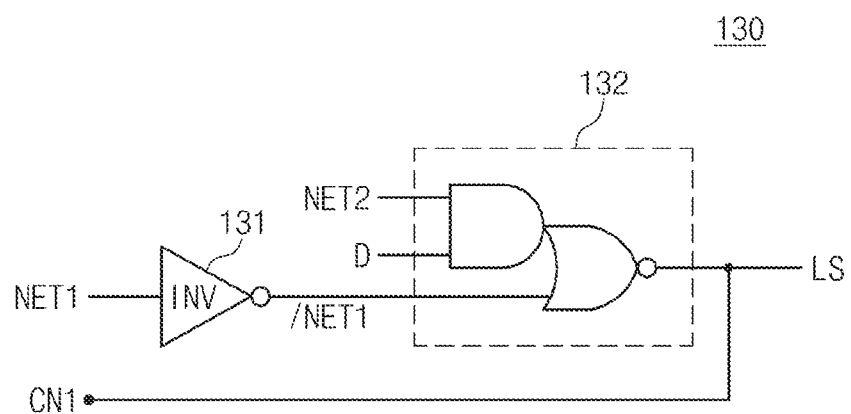
FIG. 2 is a circuit diagram illustrating an example embodiment of the combinational logic illustrated in FIG. 1.

FIG. 2 is a circuit diagram illustrating an example embodiment of the combinational logic 130 illustrated in FIG. 1.

Referring to FIG. 2, the combinational logic 130 may include an inverter 131 and an AND-OR-Inverter (AOI) gate 132.

The inverter 131 may receive and invert a voltage of the first node NET1. The AOI gate 132 may be implemented to generate the logic signal LS by executing an AOI gate operation with respect to a voltage of the second node NET2, the data D, and an output value of the inverter 131. As illustrated in FIG. 2, an output terminal of the AOI gate 132 may be connected to the first connection node CN1.

Discharge paths of the first and second nodes, which are formed according to the logic signal LS outputted from the combinational logic 130, and a discharge operation will be described with respect to FIGS. 3 and 4.

Figure 3:
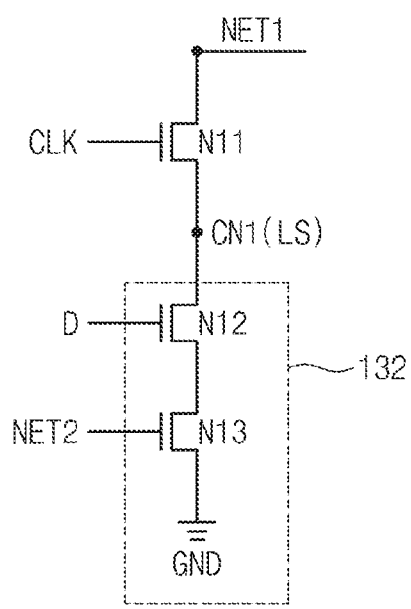
FIG. 3 is a circuit diagram illustrating an example discharge path of a first node illustrated in FIG. 1.

FIG. 3 is a circuit diagram illustrating an example discharge path of the first node NET1 illustrated in FIG. 1. For descriptive convenience, the AOI gate 132 may include a discharge path connected to the first connection node CN1. In at least one example embodiment, the discharge path may be implemented with NMOS transistors N12 and N13, which are connected serially. The NMOS transistor N12 may be turned on in response to the data D, and the NMOS transistor N13 may be turned on in response to a voltage of the second node NET2. Here, an order of the NMOS transistors N12 and N13, which are connected serially as illustrated in FIG. 3, is an example. However, the scope and spirit of inventive concepts should not be limited thereto. For example, an NMOS transistor associated with a voltage of the second node NET2 may be connected to the first connection node CN1, and an NMOS transistor associated with the data D may be connected to the ground terminal GND. Meanwhile, the discharge path of the first node NET1 illustrated in FIG. 3 is an example. However, the scope and spirit of inventive concepts should not be limited thereto.

Referring to FIGS. 1 to 3, a discharge operation about the first node NET1 is described below. When the data D has a high level and the voltage of the second node NET2 has a high level, a voltage of the first node NET1 may be discharged in response to the clock CLK having a high level. At this time, the combinational logic 130 illustrated in FIG. 2 may generate the logic signal LS having a low level. Because a voltage of the first connection node CN1 is a low level, the logic signal LS may be maintained at a low level while the voltage of the first node NET1 is discharged. Accordingly, the voltage of the second node NET2 may not be fundamentally discharged.

Figure 4:
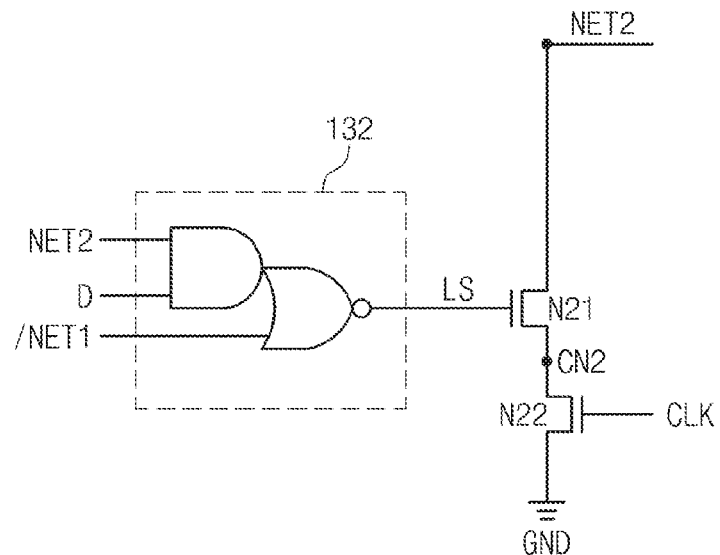
FIG. 4 is a circuit diagram illustrating another example discharge path of a first node illustrated in FIG. 1.

FIG. 4 is a circuit diagram illustrating an example discharge path of a second node NET2 illustrated in FIG. 1.

Referring to FIG. 4, a discharge path of the second node NET2 may be implemented with NMOS transistors N21 and N22, which are connected serially.

Referring to FIGS. 1 to 4, an example discharge operation about the second node NET2 is described below. When a voltage of the first node NET1 is a high level, a voltage of the second node NET2 is a low level, and data D has a low level, the AOI gate 132 of the combinational logic 130 may generate the logic signal LS having a high level. The voltage of the second node NET2 may be discharged in response to the logic signal LS having a high level and the clock CLK having a high level with reference to the sequential circuit 100 illustrated in FIG. 1. At the same or substantially the same time (e.g., simultaneously and/or concurrently), the first node NET1 may be charged with the power supply terminal VDD in response to the voltage of the second node NET2 of a low level and may keep or maintain a voltage at a high level. While the second node NET2 is discharged, the discharging of the first node NET1 may be suppressed, prevented and/or blocked (e.g., fundamentally blocked).

As described with reference to FIGS. 3 and 4, when a discharge operation is performed with respect to one of the first node NET1 and the second node NET2, the discharge operation about the other node thereof may be suppressed, prevented and/or blocked (e.g., fundamentally blocked) based on the logic signal LS provided from the combinational logic 130.

Figure 5:
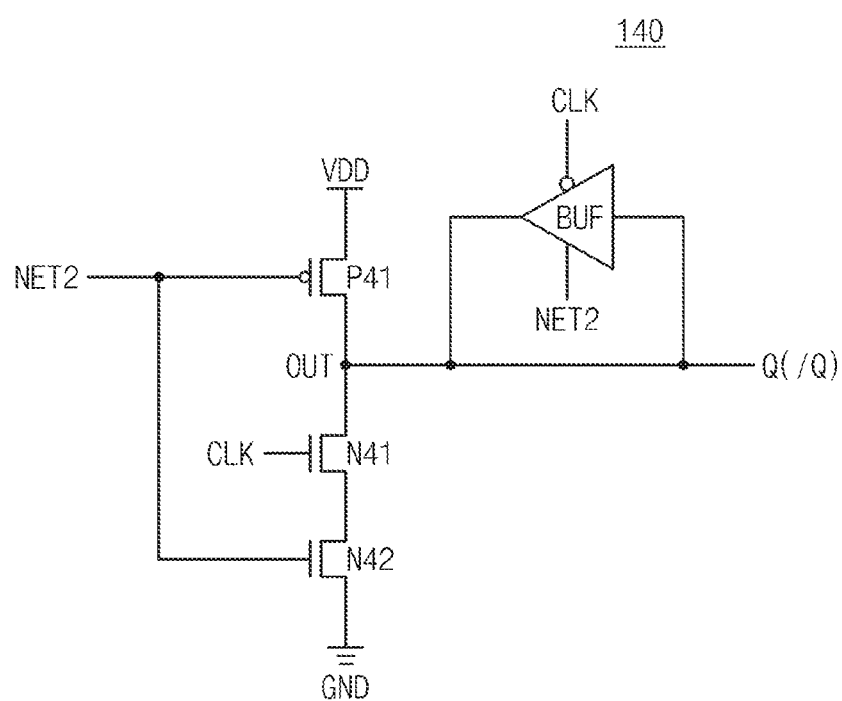
FIG. 5 is a circuit diagram illustrating an example embodiment of the latch circuit illustrated in FIG. 1.

FIG. 5 is a circuit diagram illustrating an example embodiment of the latch circuit 140 illustrated in FIG. 1.

Referring to FIGS. 1 to 5, the latch circuit 140 may include a PMOS transistor P41, NMOS transistors N41 and N42, and a buffer BUF. The PMOS transistor P41 may connect the power supply terminal VDD to an output node OUT in response to a voltage of the second node NET2. The NMOS transistor N41 may be connected to the output node OUT and may operate in response to the clock CLK. The NMOS transistor N42 may connect a drain terminal of the NMOS transistor N41 to the ground terminal GND in response to the voltage of the second node NET2. The buffer BUF may buffer a voltage of the output node OUT. In at least one example embodiment, the buffer BUF may be activated in response to the clock CLK or may be activated in response to an inverted version of the voltage of the second node NET2.

An order of the NMOS transistors N41 and N42, which are connected serially as illustrated in FIG. 5, is an example. However, the scope and spirit of inventive concepts should not be limited thereto. For example, positions of the NMOS transistors N41 and N42, which are serially connected, may be interchanged.

A sequential circuit according to at least one example embodiment of inventive concepts may be implemented to receive a scan signal. The sequential circuit may be used as a portion of a scan chain for a scan test operation.

Figure 6:
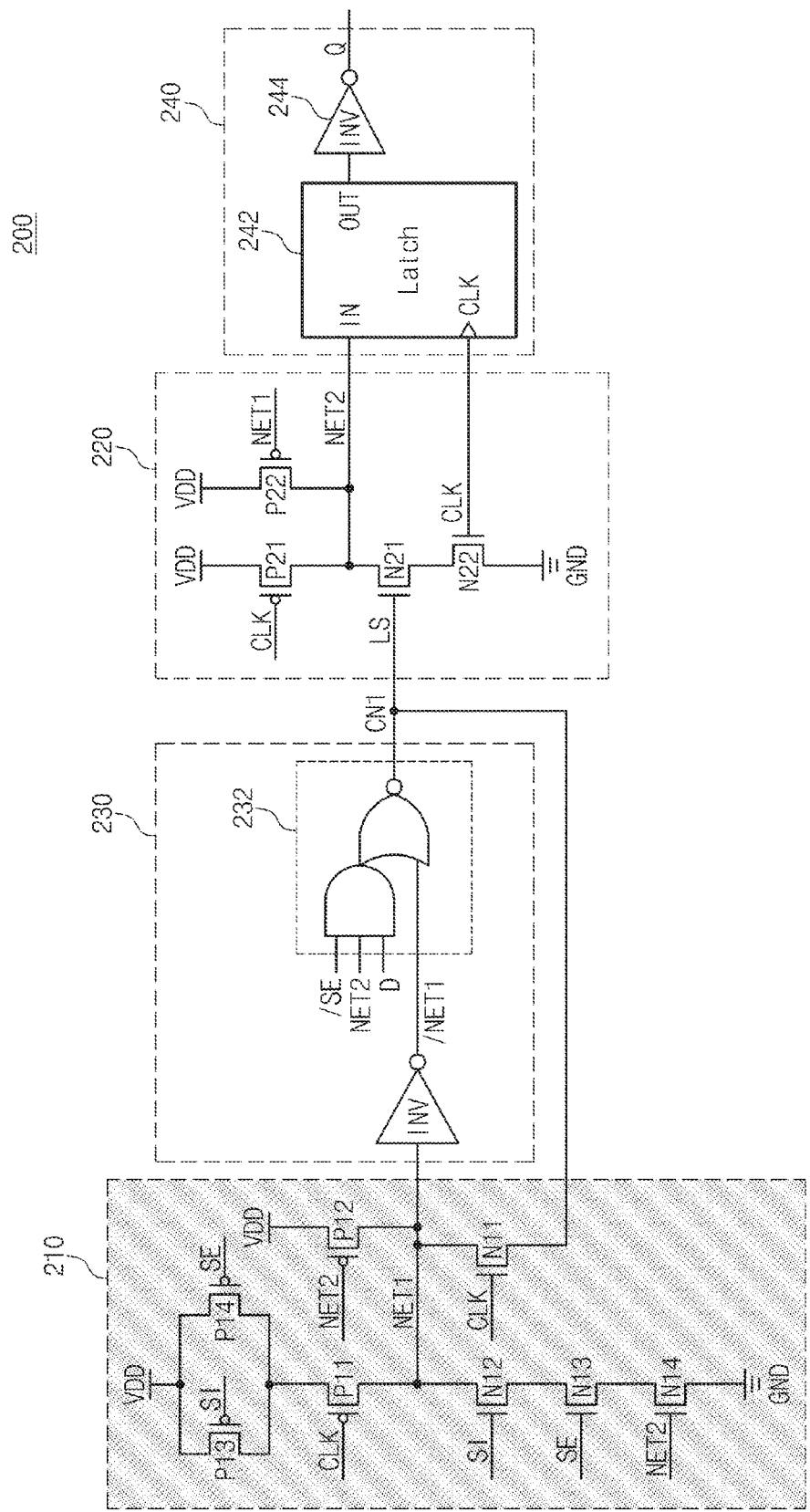
FIG. 6 is a diagram illustrating a sequential circuit according to another example embodiment of inventive concepts.

FIG. 6 is a diagram illustrating a sequential circuit according to another example embodiment of inventive concepts.

Referring to FIG. 6, a sequential circuit 200 may include a first stage 210, a second stage 220, a combinational logic 230, and a latch circuit 240. Compared with the first stage 110 illustrated in FIG. 1, the first stage 210 of the sequential circuit 200 may further include PMOS transistors P13 and P14 and NMOS transistors N12 and N13, which are connected to receive a scan input SI and a scan enable signal SE associated with a scan signal, and an NMOS transistor N14, which is connected to receive a voltage of the second node NET2. A configuration of the first stage 210 is an example, and the scope and spirit of inventive concepts should not be limited thereto. For example, positions of the first PMOS transistor P11 and the third and fourth PMOS transistors P13 and P14 may be interchanged.

Moreover, compared with the combinational logic 130 illustrated in FIGS. 1 and 2, the combinational logic 230 of the sequential circuit 200 may include an AOI gate 232, which additionally receives an inverted version (e.g., /SE) of the scan enable signal SE.

The second stage 220 may be the same or substantially the same as the second stage 120 shown in FIG. 1.

The latch circuit 240 may be similar to the latch circuit 140 shown in FIG. 1, but may further include an inverter 244 coupled to an output of a latch 242. The latch 242 may be the same or substantially the same as the latch circuit 140 in FIG. 1. The inverter 244 may invert the output of the latch 242.

At least one example embodiment of inventive concepts is exemplified as the scan input SI and the scan enable signal SE are inputted to the first stage 210 in the sequential circuit 200 illustrated in FIG. 6. However, the scope and spirit of inventive concepts should not be limited thereto. For example, a sequential circuit according to at least one example embodiment of inventive concepts may be implemented such that the scan input SI and the scan enable signal SE are inputted to the combinational logic.

Figure 7:
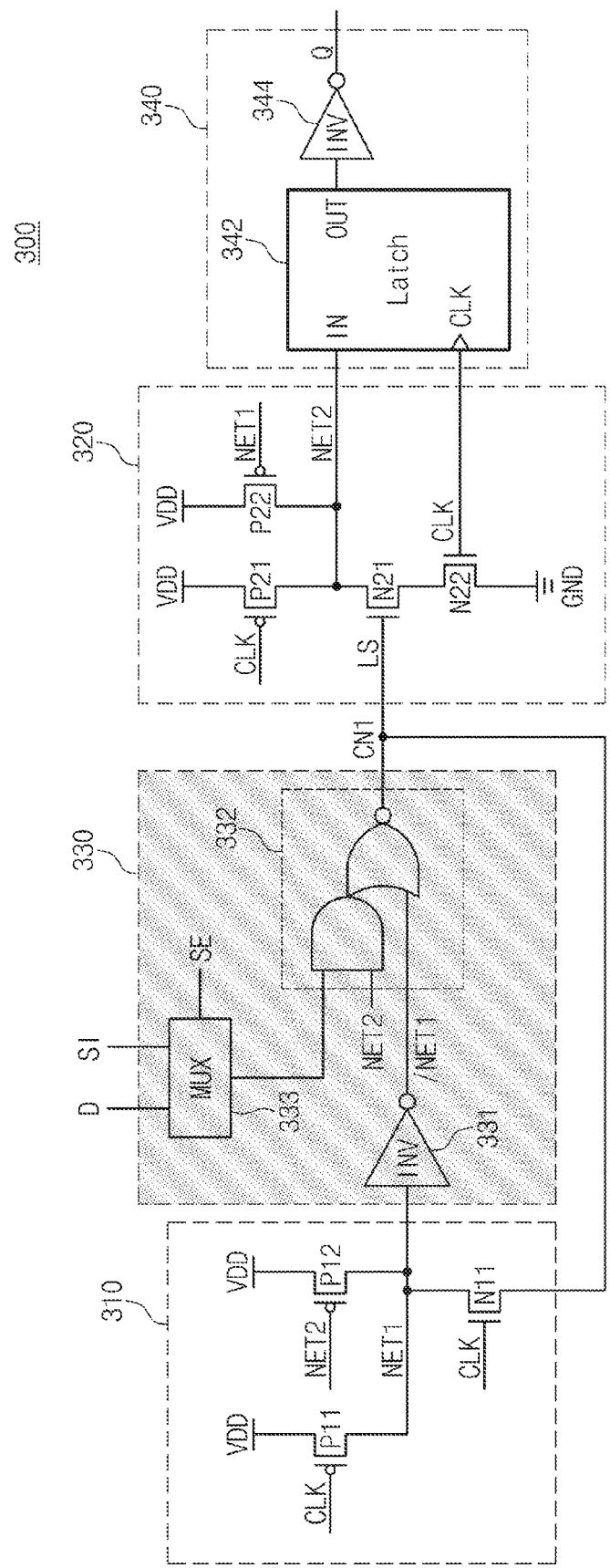
FIG. 7 is a diagram illustrating a sequential circuit according to still another example embodiment of inventive concepts.

FIG. 7 is a diagram illustrating a sequential circuit according to still another example embodiment of inventive concepts.

Referring to FIG. 7, the sequential circuit 300 may include a first stage 310, a second stage 320, a combinational logic 330 and a latch circuit 340.

Compared with the sequential circuit 200 illustrated in FIG. 6, the sequential circuit 300 may include a combinational logic 330, which is configured to be different from the sequential circuit 200 so as to additionally receive the scan input SI and the scan enable signal SE and to generate the logic signal LS.

The combinational logic 330 may include an inverter 331, an AOI gate 332, and a multiplexer 333. The multiplexer 333 may be implemented to select one of the data D and the scan input SI as an input of the AOI gate 332 in response to the scan enable signal SE. A configuration of the combinational logic 330 illustrated in FIG. 7 is an example, and the scope and spirit of inventive concepts should not be limited thereto.

The first stage 310 and the second stage 320 may be the same or substantially the same as the first stage 110 and the second stage 120, respectively. The latch circuit 340 may include a latch 342 and an inverter 344. The latch 342 and the inverter 344 may be the same or substantially the same as the latch 242 and the inverter 244, respectively.

At least some example embodiments of inventive concepts are described with regard to a data path and a scan path implemented so as to have a shared structure. However, the scope and spirit of inventive concepts should not be limited thereto. For example, sequential circuits according to example embodiments of inventive concepts may be implemented with a structure in which a data path and a scan path are divided.

Figure 8:
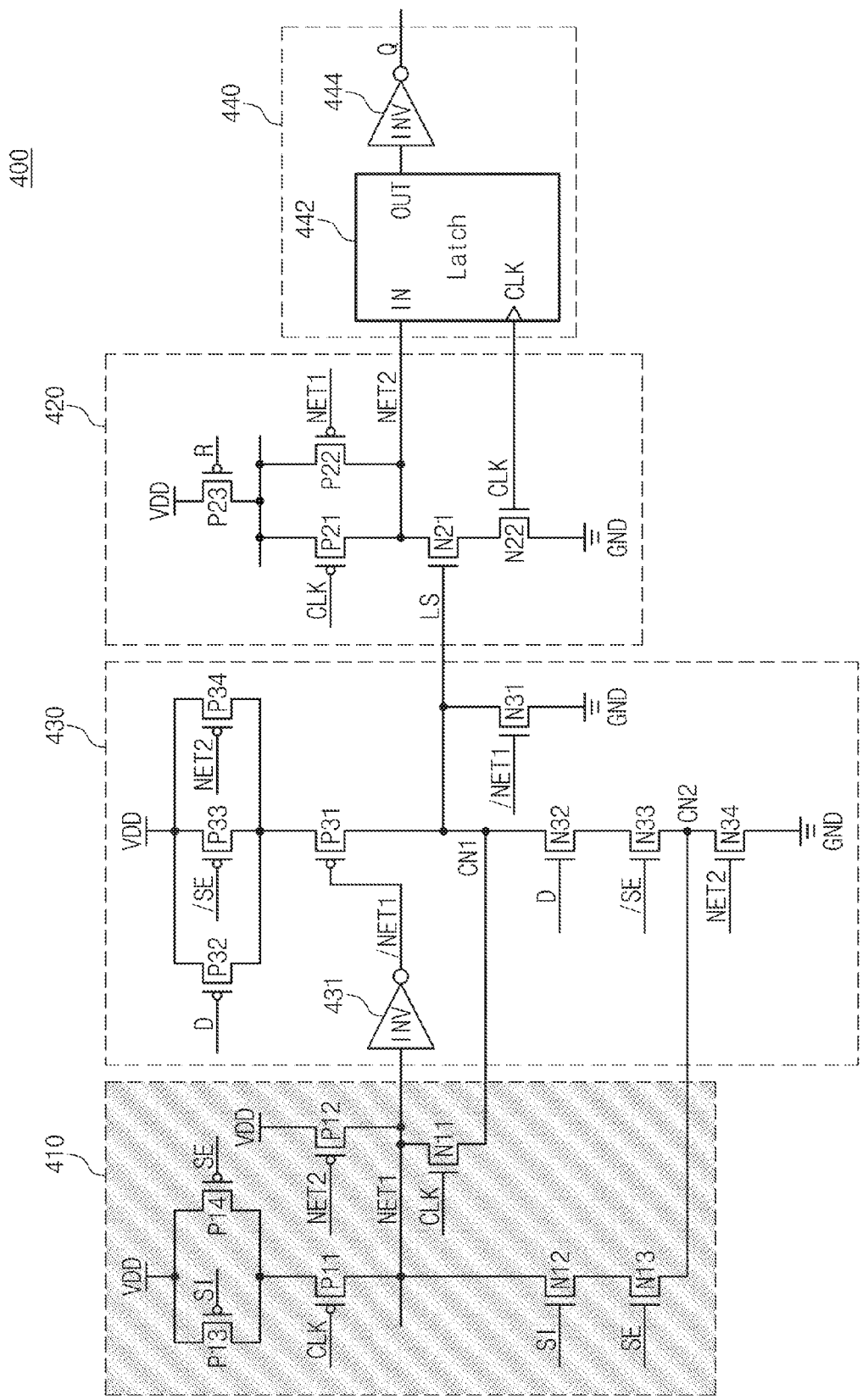
FIG. 8 is a diagram illustrating a sequential circuit according to yet another example embodiment of inventive concepts.

FIG. 8 is a diagram illustrating a sequential circuit according to yet another example embodiment of inventive concepts.

Referring to FIG. 8, a sequential circuit 400 may include a first stage 410, a second stage 420, a combinational logic 430 and a latch circuit 440.

The first stage 410 receives the scan input SI through a configuration different from the sequential circuit 300 of FIG. 7, and the combinational logic 430 receives the data D through a configuration different from the sequential circuit 300 of FIG. 7.

The first stage 410 may include: a first PMOS transistor P11, which connects the first node NET1 to a common node of both a third PMOS transistor P13 and a fourth PMOS transistor P14 in response to the clock CLK; a second PMOS transistor P12, which connects the first node NET1 to the power supply terminal VDD in response to a voltage of the second node NET2; the third PMOS transistor P13, which connects one end of the first PMOS transistor P11 to the power supply terminal VDD in response to the scan input SI; the fourth PMOS transistor P14, which connects the one end of the first PMOS transistor P11 to the power supply terminal VDD in response to the scan enable signal SE; a first NMOS transistor N11, which connects the first connection node CN1 to the first node NET1 in response to the clock CLK; a second NMOS transistor N12, which connects one end of the third NMOS transistor N13 to the first node NET1 in response to the scan input SI; and a third NMOS transistor N13, which connects the second connection node CN2 to the one end of the second NMOS transistor N12 in response to the scan enable signal SE. A configuration of the first stage 410 is an example, and the scope and spirit of inventive concepts should not be limited thereto. For example, positions of the second NMOS transistor N12 and the third NMOS transistor N13, which are connected serially, may be interchanged.

The combinational logic 430 may include: an inverter 431, which inverts a voltage of the first node NET1; a PMOS transistor P31, which connects a common node of PMOS transistors P31, P32, and P33 to the first connection node CN1 in response to an inverted voltage/NET1 of the first node NET1; the PMOS transistor P32, which connects one end of the PMOS transistor P31 to the power supply terminal VDD in response to the data D; the PMOS transistor P33, which connects the one end of the PMOS transistor P31 to the power supply terminal VDD in response to an inverted scan enable signal/SE; a PMOS transistor P34, which connects the one end of the PMOS transistor P31 to the power supply terminal VDD in response to the voltage of the second node NET2; an NMOS transistor N31, which connects the ground terminal GND to the first connection node CN1 in response to the inverted voltage/NET1 of the first node NET1; an NMOS transistor N32, which connects one end of an NMOS transistor N33 to the first connection node CN1 in response to the data; the NMOS transistor N33, which connects the second connection node CN2 to the NMOS transistor N32 in response to the inverted scan enable signal/SE; and an NMOS transistor N34, which connects the ground terminal GND to the second connection node CN2 in response to the voltage of the second node NET2. The configuration of the combinational logic 430 is an example, and the scope and spirit of inventive concepts should not be limited thereto. For example, positions of the PMOS transistor P31 and the PMOS transistors P32, P33 and P34, which are connected serially, may be interchanged. Moreover, positions of the NMOS transistors N32, N33 and N34, may be variously interchanged.

The second stage 420 may be the same or substantially the same as the second stage 120. The latch circuit 440 may include a latch 442 and an inverter 444. The latch 442 and the inverter 444 may be the same or substantially the same as the latch 242 and the inverter 244, respectively.

Unlike the sequential circuit 300 illustrated in FIG. 7, as described with reference to FIG. 8, the sequential circuit 400 may be implemented with a structure in which a scan path and a data path are divided.

Figure 9:
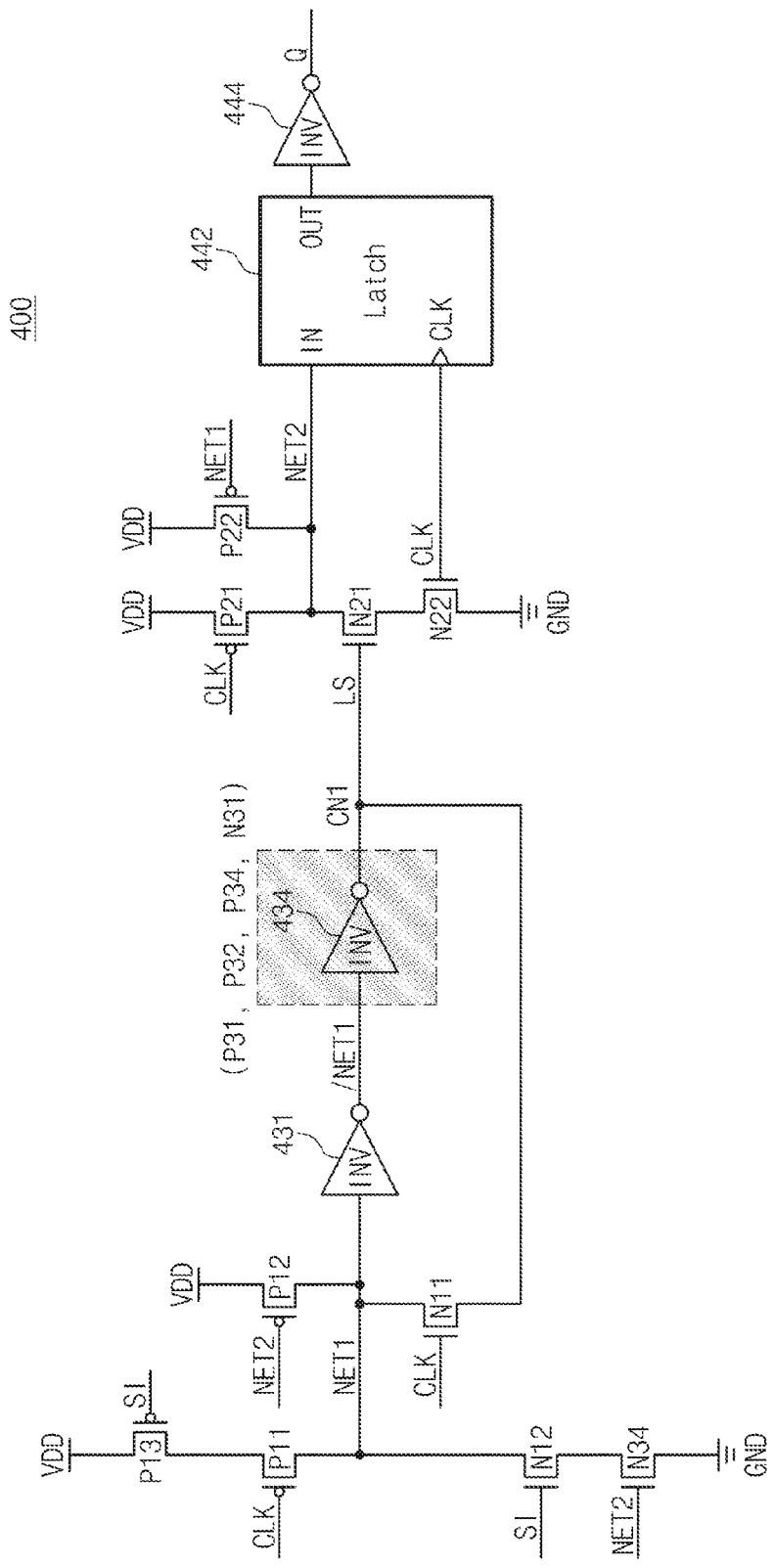
FIG. 9 is a diagram illustrating an example scan path in the sequential circuit in FIG. 8.

FIG. 9 is a diagram illustrating an example scan path in the sequential circuit 400 of FIG. 8.

Referring to FIGS. 8 and 9, when the scan enable signal SE is at a high level, a scan path may be formed. Even though PMOS transistors P14 and P33 and NMOS transistors N11, N13, N32, N33, which are meaningless or do not operate, from among components of the sequential circuit 400 of FIG. 8 are removed, a scan path, which is the same or substantially the same as illustrated in FIG. 8, may be formed according to a scan enable signal SE of a high level. The scan path according to an example embodiment of inventive concepts may include an inverter 434 composed of transistors P31, P32, P34, and N31 of FIG. 8. The inverter 434 of the scan path may not appear on a data path. Accordingly, the sequential circuit 400 may be designed such that an operation of the scan path is slower in speed than that of the data path.

A sequential circuit according to at least one example embodiment of inventive concepts may be implemented to receive a reset signal.

Figure 10:
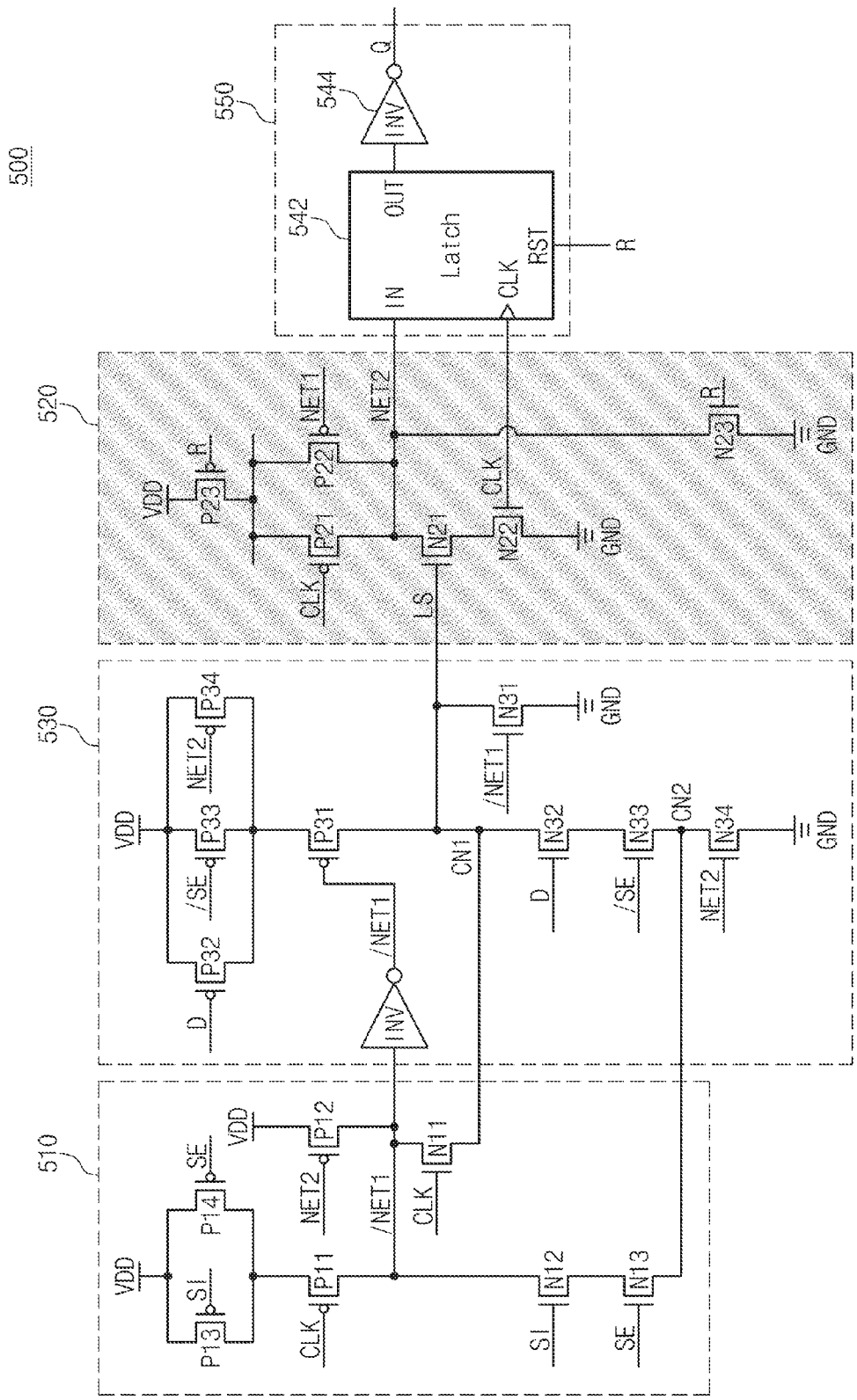
FIG. 10 is a diagram illustrating a sequential circuit according to yet another example embodiment of inventive concepts.

FIG. 10 is a diagram illustrating a sequential circuit according to yet another example embodiment of inventive concepts.

Referring to FIG. 10, a sequential circuit 500 may include a first stage 510, a second stage 520, a combinational logic 530, and a latch circuit 550.

The first stage 510 and the combinational logic 530 may be the same or substantially the same as the first stage 410 and the combinational logic 430, respectively.

The second stage 520 is configured to be different from that of the sequential circuit 400 illustrated in FIG. 8 so as to receive a reset signal R.

The second stage 520 may include a PMOS transistor P23 connecting the power supply terminal VDD and a common node of both PMOS transistors P21 and P22 in response to the reset signal R and an NMOS transistor N23 connecting the ground terminal GND with the second node NET2 in response to the reset signal R. Here, the reset signal R may be inputted to a reset port of a latch 542.

The latch circuit 550 may include a latch 542 and an inverter 544. The latch 542 and the inverter 544 may be the same or substantially the same as the latch 242 and the inverter 244, respectively.

A sequential circuit according to at least one example embodiment of inventive concepts may be implemented with a structure in which an AOI gate illustrated in FIGS. 2 to 10 is transformed into various forms.

Figure 11:
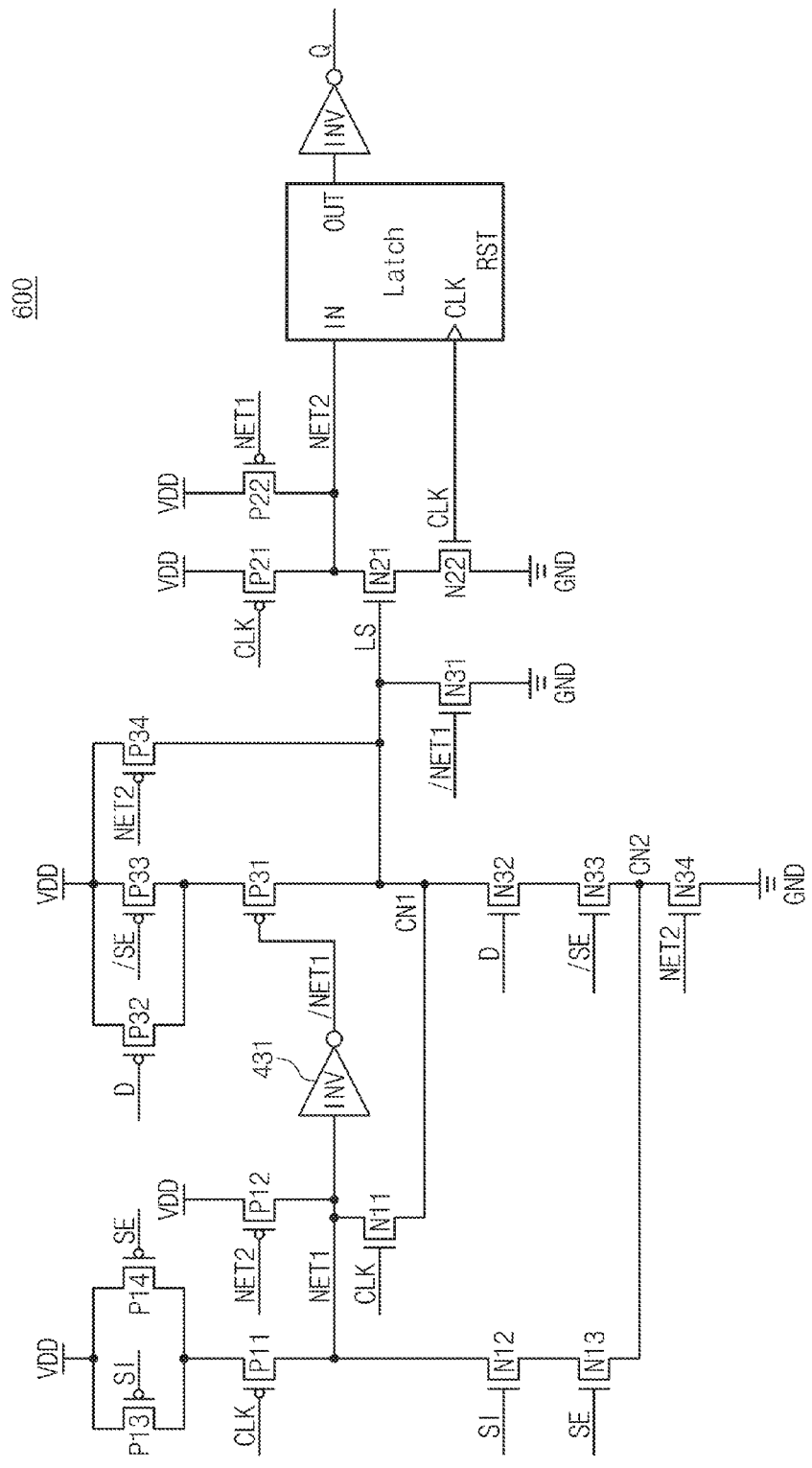
FIG. 11 is a circuit diagram illustrating an example embodiment of a sequential circuit in which an AND-OR-Inverter (AOI) gate is transformed.

FIG. 11 is a circuit diagram illustrating an example embodiment of a sequential circuit in which an AOI gate of the sequential circuit 400 illustrated in FIG. 8 is transformed.

Referring to FIG. 11, a sequential circuit 600 may include a PMOS transistor P34 having a different connection from the sequential circuit 400 illustrated in FIG. 8. The PMOS transistor P34 may connect the power supply terminal VDD to the first connection node CN1 in response to a voltage of the second node NET2.

Figure 12:
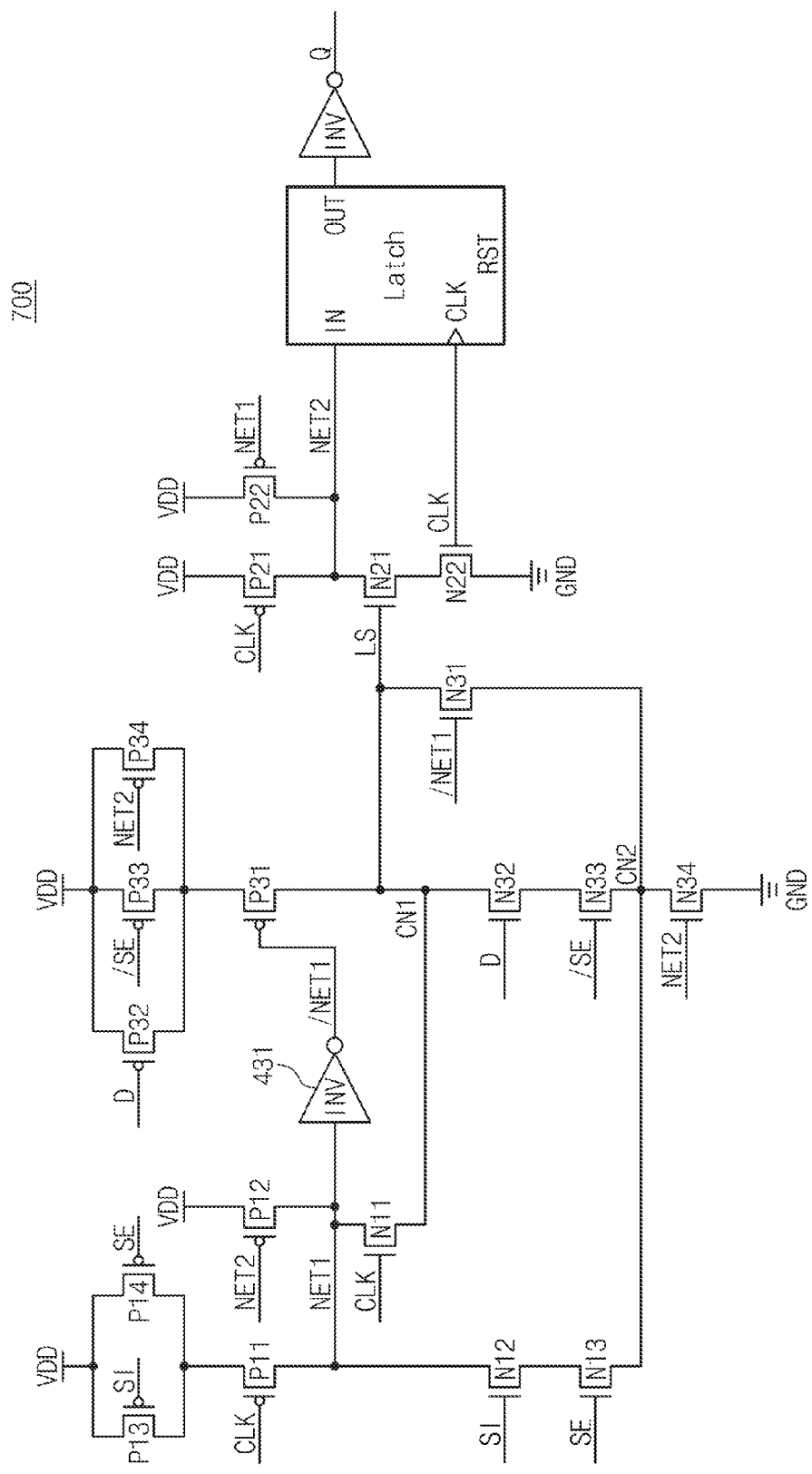
FIG. 12 is a circuit diagram illustrating another example embodiment of a sequential circuit in which an AOI gate is transformed.

FIG. 12 is a circuit diagram illustrating another example embodiment of a sequential circuit in which an AOI gate of the sequential circuit 400 illustrated in FIG. 8 is transformed.

Referring to FIG. 12, a sequential circuit 700 may include an NMOS transistor N31 having a different connection from the sequential circuit 400 illustrated in FIG. 8. The NMOS transistor N31 may connect the first connection node CN1 to the second connection node CN2 in response to an inverted voltage/NET1 of the first node NET1.

Figure 13:
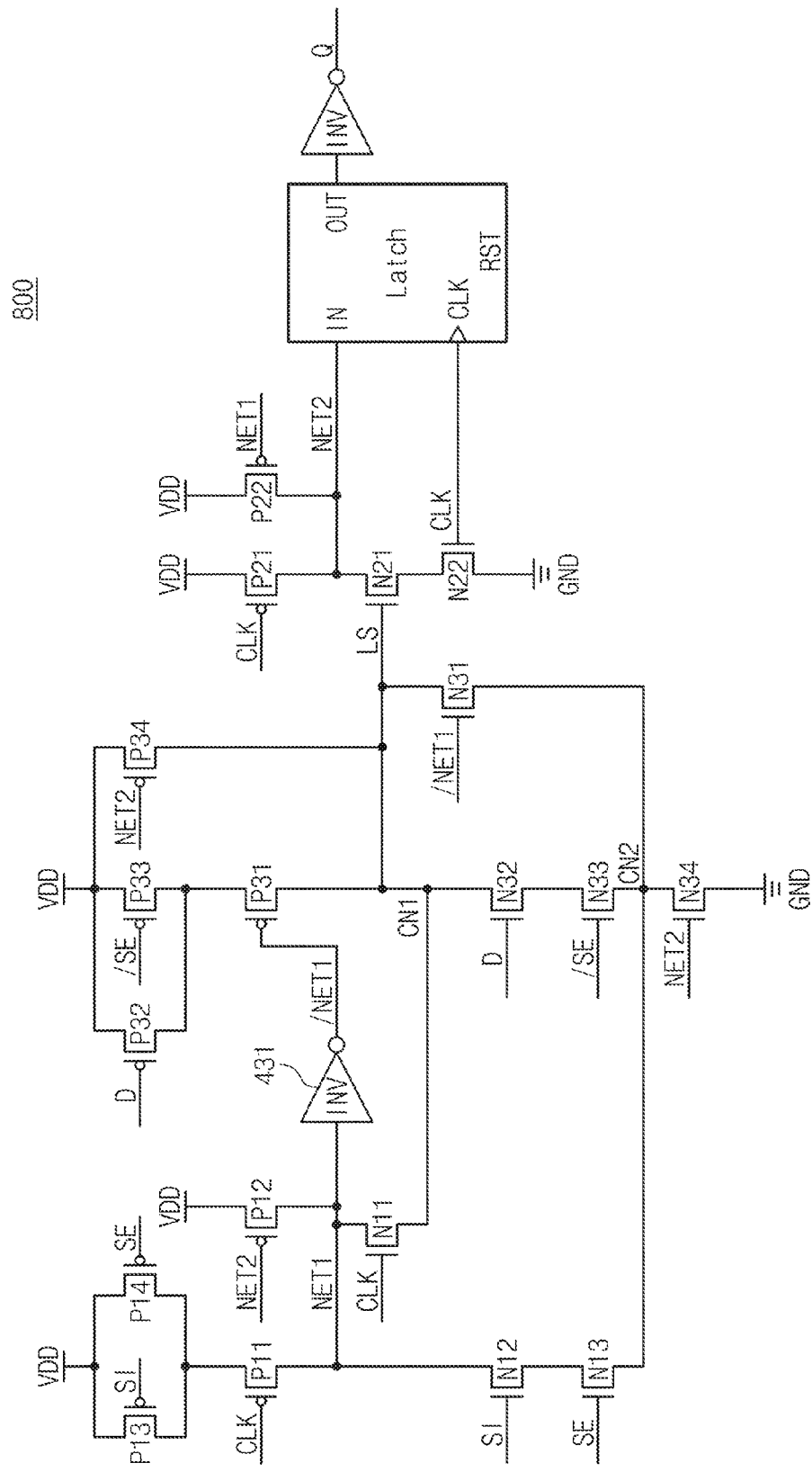
FIG. 13 is a circuit diagram illustrating yet another example embodiment of a sequential circuit in which an AOI gate is transformed.

FIG. 13 is a circuit diagram illustrating another example embodiment of a sequential circuit in which an AOI gate of the sequential circuit 400 illustrated in FIG. 8 is transformed.

Referring to FIG. 13, the sequential circuit 800 may include a PMOS transistor P34 and an NMOS transistor N31 having a different connection from the sequential circuit 400 illustrated in FIG. 8. The PMOS transistor P34 may connect the power supply terminal VDD to the first connection node CN1 in response to a voltage of the second node NET2. The NMOS transistor N31 may connect the first connection node CN1 to the second connection node CN2 in response to an inverted voltage/NET1 of the first node NET1.

Example embodiments of inventive concepts are described with regard to a discharge path of the first stage in sequential circuits illustrated in FIGS. 1 to 13 using a portion of combinational logic. However, the scope and spirit of inventive concepts should not be limited thereto. For example, the sequential circuit according to at least some example embodiments of inventive concepts may include the discharge path in the first stage regardless of the combinational logic.

Figure 14:
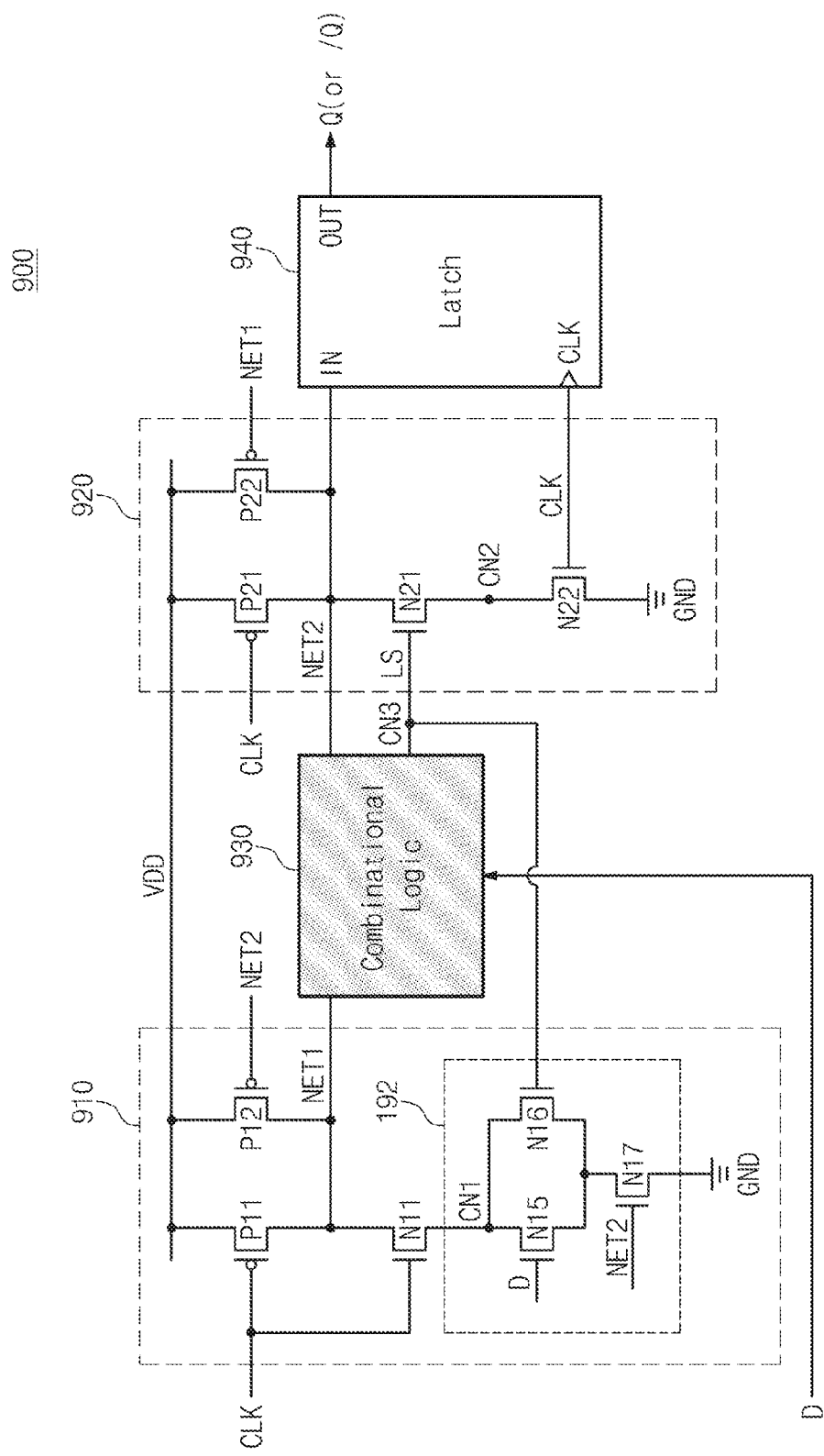
FIG. 14 is a diagram illustrating a sequential circuit according to yet another example embodiment of inventive concepts.

FIG. 14 is a diagram illustrating a sequential circuit according to yet another example embodiment of inventive concepts.

Referring to FIG. 14, the sequential circuit 900 may include a first stage 910, a second stage 920, a combinational logic 930 and a latch circuit 940. The second stage 920, the combinational logic 930 and the latch circuit 940 may be the same or substantially the same as the second stage 120, the combinational logic 130 and the latch circuit 140, respectively.

The first stage 910 of the sequential circuit 900 may be similar to the first stage 110 in FIG. 1, but may further include a discharge circuit 192 connected between the first connection node CN1 and the ground terminal GND. A discharge operation about the first node NET1 of a first stage 910 may be performed through the discharge circuit 192, which is not associated with a combinational logic 930.

As illustrated in FIG. 14, the discharge circuit 192 may include: an NMOS transistor N15, which connects one end of an NMOS transistor N17 to the first connection node CN1 in response to the data D; an NMOS transistor N16 connected to the NMOS transistor N15 in parallel; and the NMOS transistor N17 connecting the ground terminal GND to a common node of both the NMOS transistors N15 and N16 in response to a voltage of the second node NET2. In at least one example embodiment, a gate terminal of the NMOS transistor N16 may be connected to an output terminal of the combinational logic 930. The discharge circuit illustrated in FIG. 14 is an example, and the scope and spirit of inventive concepts should not be limited thereto.

Figure 15:
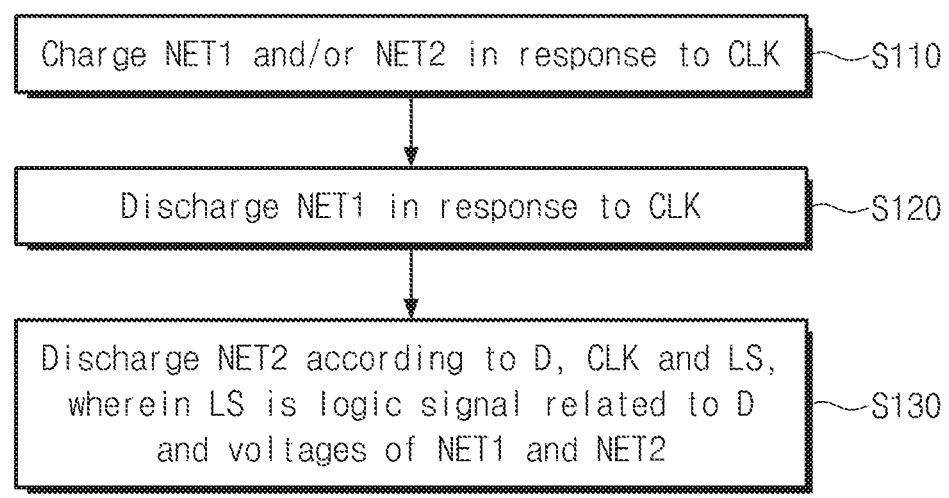
FIG. 15 is a flowchart illustrating an operating method of a sequential circuit according to an example embodiment of inventive concepts.

FIG. 15 is a flowchart illustrating an operating method of a sequential circuit according to an example embodiment of inventive concepts. Below, an operating method of a sequential circuit will be described with reference to FIGS. 1 to 15.

Referring to FIG. 15, a voltage of the first node NET1 and/or a voltage of the second node NET2 may be charged with a power supply voltage in response to the clock CLK, the data D, or the logic signal LS (S110). The voltage of the first node NET1 may be discharged in response to the clock CLK (S120). The voltage of the second node NET2 may be discharged in response to the data D, the clock CLK, and the logic signal LS. Here, the logic signal LS may be generated from the combinational logic described with reference to FIGS. 1 to 14. The combinational logic may generate the logic signal LS such that the voltage of the first node NET1 is not discharged when the voltage of the second node NET2 is discharged or such that the voltage of the second node NET2 is not discharged when the voltage of the first node NET1 is discharged.

Afterwards, data corresponding to whether the voltage of the second node NET2 is discharged may be latched, and the sequential circuit may output the latched data as a result value (e.g., Q or/Q). In at least one example embodiment, the latched data may be able to be inverted.

Moreover, the sequential circuit may reset the voltage of the first node NET1 or the voltage of the second node NET2 in response to the reset signal R.

Meanwhile, a latch operation of data is described with reference to FIG. 15. However, the sequential circuit according to at least one example embodiment of inventive concepts may form a scan path in response to the scan enable signal SE, thereby making it possible to latch the scan input SI inputted thereto.

In an operating method of the sequential circuit described with reference to FIG. 15, an illustrated order or the number of steps or operations should not limit the scope and spirit of inventive concepts. For example, steps S120 and S130 may be performed in order or in parallel.

Figure 16:
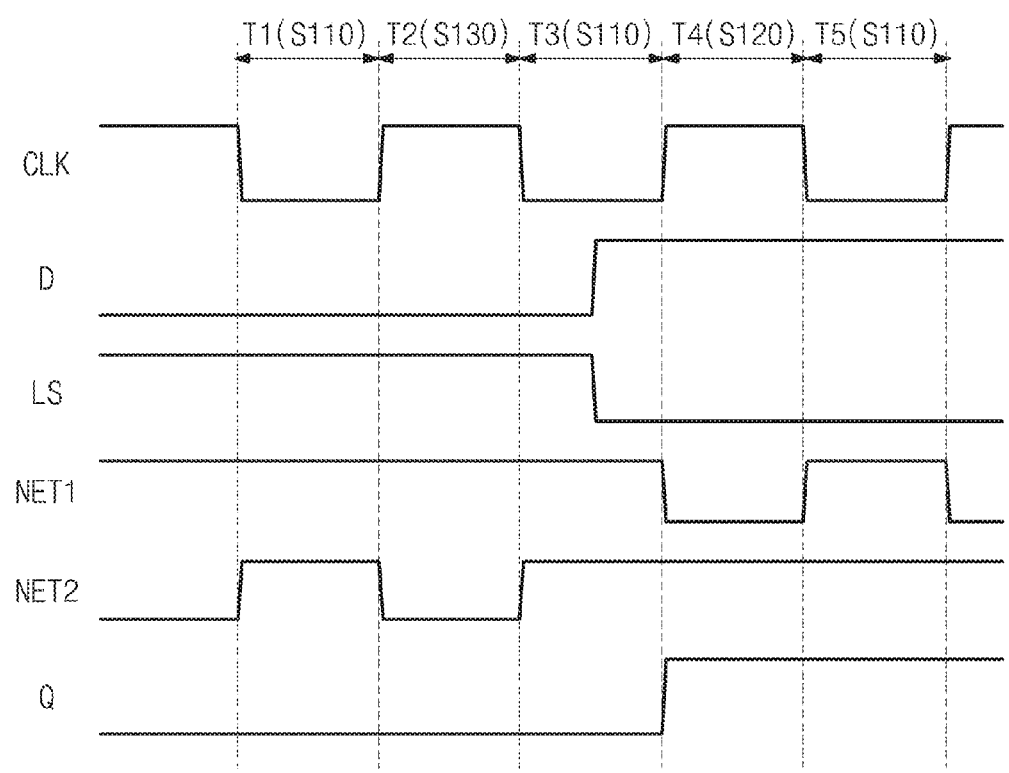
FIG. 16 is a timing diagram illustrating example operating timing of a sequential circuit according to an example embodiment of inventive concepts.

FIG. 16 is a timing diagram illustrating example operating timing of a sequential circuit according to an example embodiment of inventive concepts. Below, an operation of a sequential circuit will be described with reference to FIGS. 15 and 16.

As shown in FIG. 16, the combinational logic may control discharging of a first node at a first stage and a second node at a second stage such that the first node is discharged during a first time interval and the second node is discharged during a second time interval, wherein the first and second time intervals are different and non-overlapping time intervals.

Referring to FIGS. 15 and 16, during interval T1 (at S110), a voltage of the second node NET2 may be charged in response to the clock CLK of a low level, the data D of a low level, and the logic signal LS of a high level. In the case, a voltage of the first node NET1 may be maintained at a high level. During interval T2 (at S130), the voltage of the second node NET2 may be discharged in response to the clock CLK having a high level, the data D having a low level, and the logic signal LS having a high level. During interval T3 (at S110), when it is assumed that the data D is transitioned, the logic signal LS may be transitioned from a high level to a low level. At this time, the voltage of the second node NET2 may be charged in response to the clock CLK having a low level, the data D of a low level before a transition, and the logic signal LS of a high level before a transition. Moreover, the voltage of the first node NET1 may be maintained continuously or substantially continuously at a high level. During interval T4 (at S130), a transition of the data D may be completed. The voltage of the first node NET1 may be discharged in response to the clock CLK having a high level, the data D having a high level, and the logic signal LS having a low level. At this time, the voltage of the second node NET2 may be maintained at a high level. In the case, an output terminal Q may output a voltage, which corresponds to the voltage of the second node NET2, having a high level. During interval T5 (at S110), the voltage of the first node NET1 may be charged in response to the clock CLK having a low level, the data D having a high level, and the logic signal LS having a low level. At this time, the voltage of the second node NET2 may be maintained at a high level, and the output terminal Q may be maintained at a high level. The timing illustrated in FIG. 16 is an example, and the scope and spirit of inventive concepts should not be limited thereto.

Sequential circuits according to at least some example embodiments of inventive concepts may be applied to at least one configuration of a solid state drive (SSD).

Figure 17:
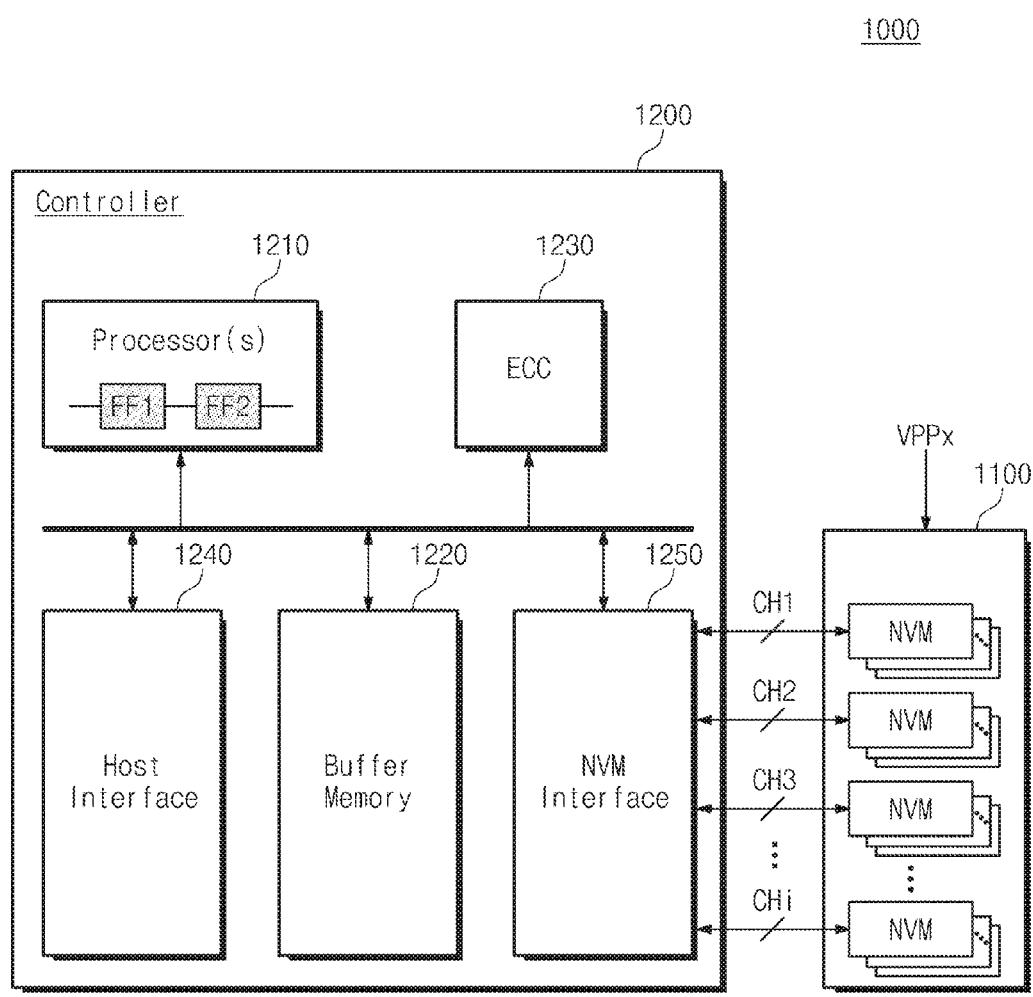
FIG. 17 is a block diagram illustrating a solid state drive (SSD) according to an example embodiment of inventive concepts.

FIG. 17 is a block diagram illustrating a SSD according to an example embodiment of inventive concepts.

Referring to FIG. 17, a SSD 1000 may include a plurality of nonvolatile memories 1100 and a SSD controller 1200.

The nonvolatile memories 1100 may be implemented to optionally receive an external high-voltage Vppx. The nonvolatile memories 1100 may include a plurality of nonvolatile memory packages connected to a plurality of channels CH1 to Chi, respectively. In this example, 'i' is an integer of two or more.

The SSD controller 1200 may be connected to the nonvolatile memories 1100 through the channels CH1 to Chi, respectively. The SSD controller 1200 may include at least one processor 1210, a buffer memory 1220, an error correction code (ECC) circuit 1230, a host interface 1240, and a nonvolatile memory interface 1250.

The processor 1210 may be implemented to process an overall operation of the SSD controller 1200. The processor 1210 may include a plurality of sequential circuits FF1 and FF2. Here, each of the sequential circuits FF1 and FF2 may be implemented with a sequential circuit described with reference to FIGS. 1 and 16. An example embodiment of inventive concepts is exemplified as the number of the sequential circuits FF1 and FF2 serially connected is two. However, the scope and spirit of inventive concepts should not be limited thereto.

The buffer memory 1220 may temporarily store data used in an operation of the SSD controller 1200. The buffer memory 1220 may include a plurality of memory lines, which stores data or a command. Here, a plurality of memory lines may be mapped to cache lines using various methods. At least some example embodiments of inventive concepts are exemplified as the buffer memory 1220 in FIG. 17 is arranged in the SSD controller 1200. However, the scope and spirit of inventive concepts may not be limited thereto. For example, the buffer memory 1220 according to an example embodiment of inventive concepts may be placed outside the SSD controller 1200.

The ECC circuit 1230 may calculate a value of an error correction code of data to be programmed during a write operation, may correct data, which is read during a reading operation, based on the value of the error correction code, and/or may correct an error repaired from the nonvolatile memories 1100. An example embodiment of inventive concepts is exemplified with regard to the ECC circuit 1230 detecting and correcting an error by a sector. However, the scope and spirit of inventive concepts may not be limited thereto.

The ECC circuit 1230 may generate a fail bit in data received from the nonvolatile memories 1100 or an error correction code (ECC) for correcting an error bit. The ECC circuit 1230 may perform an error correction encoding provided to the nonvolatile memories 1100 and may generate data to which a parity bit is added. The parity bit may be stored in the nonvolatile memories 1100. Moreover, the ECC circuit 1230 may perform error correction decoding with respect to data outputted from the nonvolatile memories 1100. The ECC circuit 1230 may correct an error using a parity bit. Although not illustrated, a code memory, which stores code data for an operation of the SSD controller 1200, may be further included in the SSD controller 1200. The code memory may be implemented with a nonvolatile memory.

The host interface 1240 may provide an interface function for interfacing with an external device. The host interface 1240 may be connected to an external host through a parallel advanced technology attachment (PATA) bus, a serial advanced technology attachment (SATA) bus, a small computer system interface (SCSI), a universal serial bus (USB), a Peripheral Component Interconnect Express (PCIe), a secure digital (SD), a serial attached SCSI (SAS), a universal flash storage (UFS), an embedded multimedia card (eMMC), a multimedia card (MMC), a NAND interface, or the like. The nonvolatile memory interface 1250 may provide an interface function between the SSD controller 1200 and the nonvolatile memories 1100. Although not illustrated, the SSD controller 1200 may install a wireless communication function (e.g., WiFi).

As high-speed sequential circuits FF1 and FF2 are applied to the processor 1210, the SSD 1000 according to at least one example embodiment of inventive concepts may include the processor 1210. Accordingly, the SSD 1000 may operate at a relatively high clock frequency.

Figure 18:
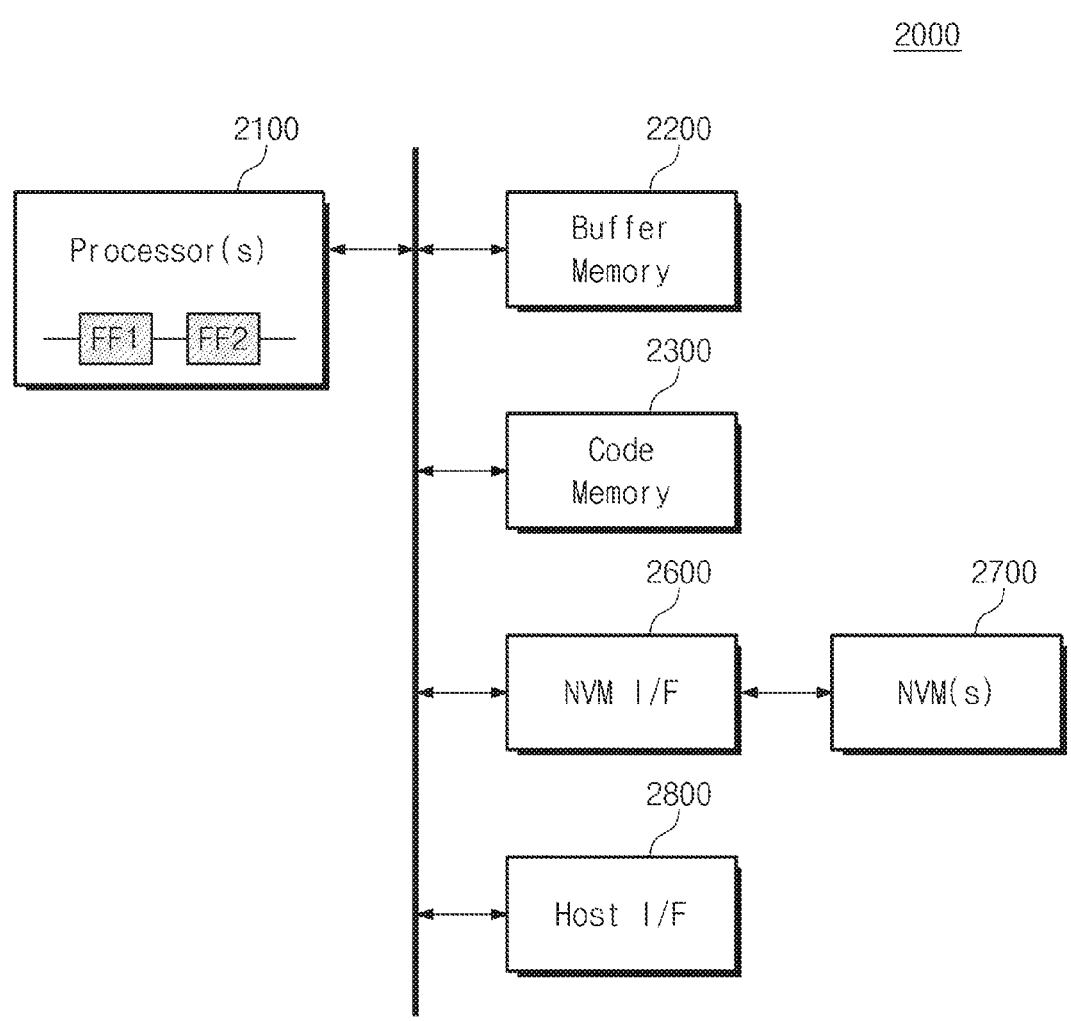
FIG. 18 is a block diagram illustrating an electronic device according to an example embodiment of inventive concepts.

FIG. 18 is a block diagram illustrating an electronic device 2000 according to an example embodiment of inventive concepts.

Referring to FIG. 18, an electronic device 2000 may include at least one processor 2100, a buffer memory 2200, a code memory 2300, a nonvolatile memory interface 2600, a nonvolatile memory device 2700, and a host interface 2800. The electronic device 2000 may be one of the following devices or a combination of two or more thereof: a data storage medium (e.g., a solid state drive (SSD), a memory stick, a universal flash storage (UFS) device), a memory card (e.g., a secure digital (SD), a multimedia card (MMC), an embedded MMC (eMMC), or the like), a smart card, a mobile device (e.g., a smartphone and Galaxy™ series), a smartphone, a tablet personal computer (PC), a mobile phone, a video phone, an e-book reader, a desktop PC, a laptop PC, a netbook computer, a personal digital assistant (PDA), a portable multimedia player (PMP), a MP3 player, a mobile medical device, an electronic bracelet, an electronic necklace, an electronic appcessory, a camera, a wearable device, an electronic clock, a wrist watch, a home appliance (e.g., a refrigerator, an air conditioner, a vacuum cleaner, an oven, an microwave oven, a washing machine, an air cleaner, or the like), an artificial intelligence robot, a television (TV), a digital video disk (DVD) player, an audio system, various kinds of medical devices (e.g., a magnetic resonance angiography (MRA) camera, a magnetic resonance imaging (MRI) camera, a computed tomography (CT) camera, a ultrasonic machine, or the like), a navigation device, a global positioning system (GPS) receiver, an event data recorder (EDR), a flight data recorder (FDR), a set-top box, a TV box (e.g., Samsung HomeSync™, AppleTV™, or googleTV™), an electronic dictionary, a car infotainment device, an electronic equipment for ship (e.g., a navigation system for ship, a gyrocompass, or the like), an avionics system, a security device, electronic clothes, an electronic key, a camcorder, a game console, a head-mounted display (HMD), a flat panel display device, an electronic picture frame, an electronic album, furniture or a portion of building or structure, which is includes a communication function, an electronic board, an electronic signature receiving device, or a projector.

The processor 2100 may be implemented to control an overall operation about the electronic device 2000. Here, the processor 2100 may be a central processing unit, an application processor, a graphic processor, or the like. In at least one example embodiment, the processor 2100 may include a secure processor or a secure element (SE), and the like. For example, the processor 2100 may have a tamper-resistant function to be protected from a tempering attack such as a micro-probing, a software attack, an eavesdropping, a fault generation, or the like. In at least one example embodiment, the processor 2100 may include at least two sequential circuits FF1 and FF2, which are connected serially. Here, each of the sequential circuits FF1 and FF2 may be implemented with the sequential circuit described with reference to FIGS. 1 and 15. In at least one example embodiment, each of the sequential circuits FF1 and FF2 may be implemented with the same or substantially the same type of sequential circuit. In at least one other example embodiment, each of the sequential circuits FF1 and FF2 may be implemented with different types of sequential circuits.

The buffer memory 2200 may operate according to control of the processor 2100. The buffer memory 2200 may temporarily store data which is processed by the processor 2100 or may buffer data, which is transmitted to the nonvolatile memory device 2700, or data which is transmitted from the nonvolatile memory device 2700. In at least one example embodiment, the buffer memory 2200 may be a random access memory (RAM), a static random access memory (SRAM), and a phase-change random access memory (PRAM).

The code memory 2300 may be implemented to store a code and/or an application for managing or operating the electronic device 2000. In at least one example embodiment, the code memory 2300 may be a read only memory (ROM) or a PRAM. Data exchange with the nonvolatile memory device 2700 may be performed through the nonvolatile memory interface 2600. The host interface 2800 may be connected to an external host through a parallel advanced technology attachment (PATA) bus, a serial advanced technology attachment (SATA) bus, a small computer system interface (SCSI), a universal serial bus (USB), a Peripheral Component Interconnect Express (PCIe), SD, a serial attached SCSI (SAS), a UFS, an eMMC, an MMC, a NAND interface, or the like.

Although not illustrated, the electronic device 2000 may install a wireless communication function (e.g., Wi-Fi). Meanwhile, the electronic device 2000 may further include a component, which is not illustrated in FIG. 18, or may not include at least one (except a cryptographic processing circuit) of the components illustrated in FIG. 18.

Figure 19:
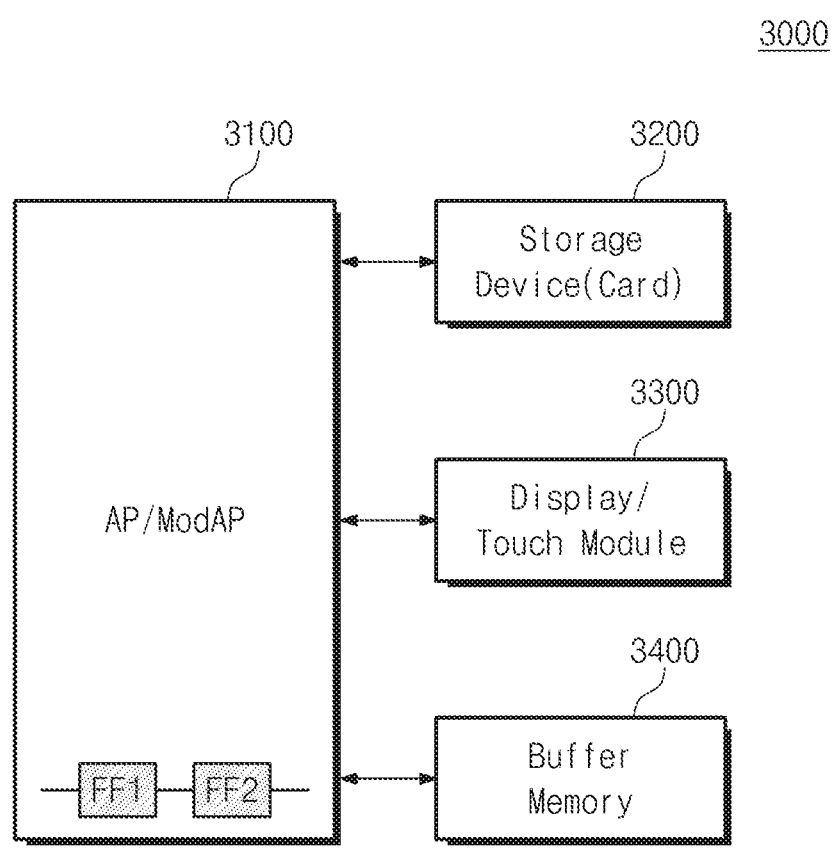
FIG. 19 is a block diagram illustrating a mobile device according to an example embodiment of inventive concepts.

FIG. 19 is a block diagram illustrating a mobile device 3000 according to an example embodiment of inventive concepts.

Referring to FIG. 19, a mobile device 3000 may include a processor (AP/ModAP) 3100, a storage device 3200, a display/touch module 3300, and a buffer memory 3400.

The processor 3100 may be implemented to control an overall operation of the mobile device 3000 and a wired/wireless communication with an external device. For example, the processor 3100 may be an application processor (AP), an integrated modem application processor (hereinafter referred to as "ModAP"), or the like. The processor 3100 may include at least two sequential circuits FF1 and FF2, which are described with reference to FIGS. 1 to 14.

In at least one example embodiment, sequential circuits FF1 and FF2 of the processor 3100 may be implemented with a sequential circuit described with reference to FIGS. 1 and 6. In at least one other example embodiment, the processor 3100 may include the first sequential circuit FF1 and the second sequential circuit FF2, which are serially connected to perform a scan test in response to a scan signal. Here, each of the first sequential circuit FF1 and the second sequential circuit FF2 may be implemented with a sequential circuit receiving the scan input SI and the scan enable signal SE which are described with reference to FIGS. 6 to 13.

The buffer memory 3400 may be implemented to temporarily store data, which is needed when the mobile device 3000 performs a process operation. The display/touch module 3300 may be implemented to display data processed from the processor 3100 or to receive data from a touch panel. The storage device 3200 may be implemented so as to store data of a user. The storage device 3200 may be an eMMC, an SSD, a UFS, or the like.

Sequential circuits and/or operating methods thereof according to one or more example embodiments of inventive concepts may suppress and/or minimize influence due to a clock change by complementarily determining whether voltages of nodes are discharged in response to a logic signal and a clock according to voltages of complementary nodes and a state of data.

Sequential circuits and/or operating methods thereof according to one or more example embodiments of inventive concepts may increase a discharge speed by being implemented with NMOS transistors of a 2-stack structure. Accordingly, a latch operation may be performed at a relatively high speed.

Sequential circuits and/or operating methods thereof according to one or more example embodiments of inventive concepts may enable increases in a clock frequency by reducing a setup time or a CQ delay.

Therefore, it should be understood that the example embodiments discussed herein are not limiting, but illustrative. While inventive concepts have been described with reference to example embodiments, it will be apparent to those skilled in the art that various changes and modifications may be made without departing from the spirit and scope of inventive concepts.

What is claimed is:

1. A sequential circuit, comprising:
    a first stage configured to charge a voltage of a first node in response to a clock and to discharge the voltage of the first node in response to the clock, a voltage of a second node, and data;
    a second stage configured to charge the voltage of the second node in response to the clock and to discharge the voltage of the second node in response to the clock and a logic signal;
    a combinational logic configured to generate the logic signal using the voltage of the first node, the voltage of the second node, and the data; and
    a latch circuit configured to latch the voltage of the second node in response to the clock,
    wherein the combinational logic generates the logic signal such that the voltage of the second node is not discharged when the voltage of the first node is discharged or such that the voltage of the first node is not discharged when the voltage of the second node is discharged.

2. The sequential circuit of claim 1, wherein the first stage comprises:
    a first PMOS transistor configured to connect the first node to a power supply terminal in response to the clock;
    a second PMOS transistor configured to connect the first node to the power supply terminal in response to the voltage of the second node; and
    a first NMOS transistor configured to connect a first connection node to the first node in response to the clock.

3. The sequential circuit of claim 2, wherein the second stage comprises:
    a first PMOS transistor configured to connect the second node to the power supply terminal in response to the clock;
    a second PMOS transistor configured to connect the second node to the power supply terminal in response to the voltage of the first node;
    a first NMOS transistor having one end connected to the second node in response to the logic signal; and
    a second NMOS transistor configured to connect a ground terminal to other end of the first NMOS transistor of the second stage in response to the clock,
    wherein the first connection node is connected to a gate terminal of the first NMOS transistor of the second stage.

4. The sequential circuit of claim 2, wherein the combinational logic comprises:
    an inverter configured to invert the voltage of the first node; and
    an AND-OR-Inverter (AOI) gate configured to receive the voltage of the second node, the data, and an output value of the inverter and to generate the logic signal.

5. The sequential circuit of claim 4, wherein the AOI gate comprises:
    a first NMOS transistor having one end connected to the second node in response to the logic signal; and
    a second NMOS transistor configured to connect a ground terminal to other end of the first NMOS transistor of the AOI gate in response to the clock.

6. The sequential circuit of claim 1, wherein the latch circuit comprises:
    a first PMOS transistor configured to connect an output node to a power supply terminal in response to the voltage of the second node;
    a first NMOS transistor having one end connected to the output node in response to the clock; and
    a second NMOS transistor configured to connect other end of the first NMOS transistor of the latch circuit to a ground terminal in response to the voltage of the second node; and
    a buffer configured to buffer a voltage of the output node.

7. The sequential circuit of claim 6, wherein the latch circuit further comprises:
    an inverter configured to invert the voltage of the output node.

8. The sequential circuit of claim 1, wherein the first stage comprises:
    a first PMOS transistor having one end connected to the first node in response to the clock;
    a second PMOS transistor configured to connect the first node to a power supply terminal in response to the voltage of the second node;
    a third PMOS transistor configured to connect other end of the first PMOS transistor of the first stage to the power supply terminal in response to a scan input;
    a fourth PMOS transistor configured to connect the one end of the first PMOS transistor of the first stage to the power supply terminal in response to a scan enable signal;
    a first NMOS transistor configured to connect a first connection node to the first node in response to the clock;
    a second NMOS transistor having one end connected to the first node in response to the scan input;
    a third NMOS transistor having one end connected to other end of the second NMOS transistor of the first stage in response to the scan enable signal; and
    a fourth NMOS transistor configured to connect other end of the third NMOS transistor of the first stage to a ground terminal in response to the voltage of the second node,
    wherein the combinational logic comprises:
    an inverter configured to invert the voltage of the first node; and
    an AOI gate configured to receive an output value of the inverter, an inverted scan enable signal, the voltage of the second node, and the data and to generate the logic signal, and
    wherein the first connection node is connected to an output terminal of the AOI gate.

9. The sequential circuit of claim 1, wherein the first stage comprises:

a first PMOS transistor configured to connect the first node to a power supply terminal in response to the clock, a second PMOS transistor configured to connect the first node to the power supply terminal in response to the voltage of the second node, and a first NMOS transistor configured to connect a first connection node to the first node in response to the clock, wherein the combinational logic comprises:

an inverter configured to invert the voltage of the first node, and a multiplexer configured to select one of the data or a scan input in response to a scan enable signal, and an AOI gate configured to receive an output value of the multiplexer, the voltage of the second node, and an output value of the inverter and to generate the logic signal, and wherein the first connection node is connected to an output terminal of the A01 gate.

10. The sequential circuit of claim 1, wherein the first stage comprises:

a first PMOS transistor having one end connected to the first node in response to the clock;

a second PMOS transistor configured to connect the first node to a power supply terminal in response to the voltage of the second node;

a third PMOS transistor configured to connect other end of the first PMOS transistor of the first stage to the power supply terminal in response to a scan input;

a fourth PMOS transistor configured to connect the one end of the first PMOS transistor of the first stage to the power supply terminal in response to a scan enable signal;

a first NMOS transistor configured to connect a first connection node to the first node in response to the clock;

a second NMOS transistor having one end connected to the first node in response to the scan input; and a third NMOS transistor configured to connect a second connection node to other end of the second NMOS transistor of the first stage in response to the scan enable signal, and wherein the combinational logic comprises:

an inverter configured to invert the voltage of the first node;

a first PMOS transistor having one end connected to the first connection node in response to an output value of the inverter;

a second PMOS transistor configured to connect other end of the first PMOS transistor of the combinational logic to the power supply terminal in response to the data, a third PMOS transistor configured to connect the one end of the first PMOS transistor of the combinational logic to the power supply terminal in response to an inverted scan enable signal, a fourth PMOS transistor configured to connect the one end of the first PMOS transistor of the combinational logic to the power supply terminal in response to the voltage of the second node, a first NMOS transistor configured to connect a ground terminal to the first connection node in response to the output value of the inverter, a second NMOS transistor having one end connected to the first connection node in response to the data, a third NMOS transistor configured to connect other end of the second NMOS transistor of the combinational logic to the second connection node in response to the inverted scan enable signal, and a fourth NMOS transistor configured to connect the ground terminal to the second connection node in response to the voltage of the second node.

11. A sequential circuit, comprising:

a first stage comprising:

a first PMOS transistor having one end connected to a first node in response to a clock, a second PMOS transistor configured to connect the first node to a power supply terminal in response to a voltage of a second node, a third PMOS transistor configured to connect other end of the first PMOS transistor to the power supply terminal in response to a scan input, a fourth PMOS transistor configured to connect the one end of the first PMOS transistor to the power supply terminal in response to a scan enable signal, a first NMOS transistor configured to connect a first connection node to the first node in response to the clock, a second NMOS transistor having one end connected to the first node in response to the scan input, and a third NMOS transistor configured to connect a second connection node to other end of the second NMOS transistor in response to the scan enable signal;

a second stage comprising:

a first PMOS transistor configured to connect the second node to the power supply terminal in response to the clock, a second PMOS transistor configured to connect the second node to the power supply terminal in response to a voltage of the first node, a first NMOS transistor connected to the second node in response to a logic signal, and a second NMOS transistor configured to connect a ground terminal to other end of the first NMOS transistor of the second stage in response to the clock;

a combinational logic configured to receive data, the voltage of the first node, and a voltage of the second node and to generate the logic signal, wherein an output terminal of the combinational logic outputting the logic signal is connected to the first connection node; and a latch circuit configured to latch the voltage of the second node in response to the clock.

12. The sequential circuit of claim 11, wherein the combinational logic comprises:

an inverter configured to invert the voltage of the first node;

a first PMOS transistor having one end connected to the first connection node in response to an output value of the inverter;

a second PMOS transistor configured to connect other end of the first PMOS transistor of the combinational logic to the power supply terminal in response to the data;

a third PMOS transistor configured to connect the one end of the first PMOS transistor of the combinational logic to the power supply terminal in response to an inverted version of the scan enable signal;

a fourth PMOS transistor configured to connect the one end of the first PMOS transistor of the combinational logic to the power supply terminal in response to the voltage of the second node;

a first NMOS transistor configured to connect the ground terminal to the first connection node in response to the output value of the inverter;
a second NMOS transistor having one end connected to the first connection node in response to the data;
a third NMOS transistor configured to connect other end of the second NMOS transistor of the combinational logic to the second connection node in response to the inverted version of the scan enable signal; and
a fourth NMOS transistor configured to connect the ground terminal to the second connection node in response to the voltage of the second node.

13. The sequential circuit of claim 11, wherein the second stage further comprises:
a third PMOS transistor configured to connect the one end of the first PMOS transistor of the second stage to the power supply terminal in response to a reset signal and to connect one end of the second PMOS transistor of the second stage to the power supply terminal in response to the reset signal; and
a third NMOS transistor configured to connect the ground terminal to the second node in response to the reset signal.

14. The sequential circuit of claim 11, wherein the combinational logic comprises:
an inverter configured to invert the voltage of the first node;
a first PMOS transistor having one end connected to the first connection node in response to an output value of the inverter;
a second PMOS transistor configured to connect other end of the first PMOS transistor of the combinational logic to the power supply terminal in response to the data;
a third PMOS transistor configured to connect the one end of the first PMOS transistor of the combinational logic to the power supply terminal in response to an inverted version of a scan enable signal;
a fourth PMOS transistor configured to connect the first connection node to the power supply terminal in response to the voltage of the second node;
a first NMOS transistor configured to connect the ground terminal to the first connection node in response to the output value of the inverter;
a second NMOS transistor having one end connected to the first connection node in response to the data,
a third NMOS transistor configured to connect other end of the second NMOS transistor of the combinational logic to the second connection node in response to the inverted version of the scan enable signal; and
a fourth NMOS transistor configured to connect the ground terminal to the second connection node in response to the voltage of the second node.

15. The sequential circuit of claim 11, wherein the combinational logic comprises:
an inverter configured to invert the voltage of the first node;
a first PMOS transistor having one end connected to the first connection node in response to an output value of the inverter;
a second PMOS transistor configured to connect other end of the first PMOS transistor of the combinational logic to the power supply terminal in response to the data;
a third PMOS transistor configured to connect the one end of the first PMOS transistor of the combinational logic to the power supply terminal in response to an inverted version of a scan enable signal;
a fourth PMOS transistor configured to connect the one end of the first PMOS transistor of the combinational logic to the power supply terminal in response to the voltage of the second node;
a first NMOS transistor configured to connect the second connection node to the first connection node in response to the output value of the inverter;
a second NMOS transistor having one end connected to the first connection node in response to the data,
a third NMOS transistor configured to connect other end of the second NMOS transistor of the combinational logic to the second connection node in response to the inverted version of the scan enable signal, and
a fourth NMOS transistor configured to connect the ground terminal to the second connection node in response to the voltage of the second node.

16. The sequential circuit of claim 11, wherein the combinational logic comprises:
an inverter configured to invert the voltage of the first node,
a first PMOS transistor having one end connected to the first connection node in response to an output value of the inverter,
a second PMOS transistor configured to connect other end of the first PMOS transistor of the combinational logic to the power supply terminal in response to the data;
a third PMOS transistor configured to connect the one end of the first PMOS transistor of the combinational logic to the power supply terminal in response to an inverted version of a scan enable signal;
a fourth PMOS transistor configured to connect the first connection node to the power supply terminal in response to the voltage of the second node;
a first NMOS transistor configured to connect the second connection node to the first connection node in response to the output value of the inverter;
a second NMOS transistor having one end connected to the first connection node in response to the data;
a third NMOS transistor configured to connect other end of the second NMOS transistor of the combinational logic to the second connection node in response to the inverted version of the scan enable signal; and
a fourth NMOS transistor configured to connect the ground terminal to the second connection node in response to the voltage of the second node.

17. A sequential circuit, comprising:
a first stage comprising:
a first PMOS transistor configured to connect a first node to a power supply terminal in response to a clock,
a second PMOS transistor configured to connect the first node to the power supply terminal in response to a voltage of a second node, and
a first NMOS transistor configured to connect a first connection node to the first node in response to the clock;
a second stage comprising:
a first PMOS transistor configured to connect the second node to the power supply terminal in response to the clock,
a second PMOS transistor configured to connect the second node to the power supply terminal in response to a voltage of the first node,
a first NMOS transistor having one end connected to the second node in response to a logic signal, and a second NMOS transistor configured to connect a ground terminal to other end of the first NMOS transistor of the second stage in response to the clock;
a combinational logic comprising:
an inverter configured to invert the voltage of the second node, an AO1 gate configured to receive an output value of the inverter, the voltage of the second node, and data and to generate the logic signal; and
a latch circuit configured to latch the voltage of the second node in response to the clock.

18. The sequential circuit of claim 17, wherein the first connection node is connected to an output terminal of the AOI gate.

19. The sequential circuit of claim 17, further comprising:
a discharge circuit configured to discharge the voltage of the first node between the first connection node and the ground terminal.

20. The sequential circuit of claim 17, further comprising:
an inverter configured to invert an output value of the latch circuit.

21. An operating method of a sequential circuit, the method comprising:
charging a first node and a second node in response to a clock;
discharging a voltage of the first node in response to the clock; and
discharging a voltage of the second node in response to the clock and a logic signal,
wherein the logic signal is generated according to a logical combination of the voltage of the first node, the voltage of the second node, and data,
wherein the voltage of the second node is not discharged when the voltage of the first node is discharged, and
wherein the voltage of the first node is not discharged when the voltage of the second node is discharged.

22. The method of claim 21, further comprising:
latching data corresponding to the voltage of the second node in response to the clock.

23. The method of claim 22, further comprising:
inverting the data.

24. The method of claim 21, further comprising:
forming a scan path in response to a scan enable signal.

25. The method of claim 21, further comprising:
resetting the voltage of the first node and the voltage of the second node in response to a reset signal.

26. A processor, comprising:
a first sequential circuit; and
a second sequential circuit serially connected to the first sequential circuit,
wherein each of the first and second sequential circuits generates a logic signal in response to a voltage of a first node, a voltage of a second node, and data, and determines whether to discharge the voltage of the first node or whether to discharge the voltage of the second node, in response to the logic signal,
wherein the voltage of the second node is not discharged when the voltage of the first node is discharged, and
wherein the voltage of the first node is not discharged when the voltage of the second node is discharged.

27. A sequential circuit comprising:
a first stage circuit;
a second stage circuit; and
a combinational logic circuit coupled between a first node at the first stage circuit and a second node at the second stage circuit, the combinational logic circuit configured to control discharging of the first node and the second node based on a voltage at the first node, a voltage at the second node, and input data, the combinational logic further configured to control discharging of the first node and the second node such that the first node is discharged during a first time interval and the second node is discharged during a second time interval, the first and second time intervals being different and non-overlapping time intervals.

28. The sequential circuit of claim 27, further comprising:
a latch circuit configured to latch the voltage at the second node in response to a clock signal.

29. The sequential circuit of claim 27, wherein
the combinational logic circuit is further configured to generate a logic signal to control the discharging of the first node and the second node, the logic signal generated based on the voltage at the first node, the voltage at the second node, and the input data.

30. The sequential circuit of claim 29, wherein
The first stage circuit is configured to charge the first node based on a clock signal;
the first stage circuit is configured to discharge the first node based on the clock signal, the voltage at the second node, and the input data;
the second stage circuit is configured to charge the second node based on the clock signal; and
the second stage is configured to discharge the second node based on the clock signal and the logic signal.

* * * * *